US009243316B2

United States Patent
Larson, III et al.

(10) Patent No.: US 9,243,316 B2
(45) Date of Patent: Jan. 26, 2016

(54) METHOD OF FABRICATING PIEZOELECTRIC MATERIAL WITH SELECTED C-AXIS ORIENTATION

(75) Inventors: John Larson, III, Palo Alto, CA (US); Sergey Mishin, Goleta, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 909 days.

(21) Appl. No.: 12/692,108

(22) Filed: Jan. 22, 2010

(65) Prior Publication Data
US 2011/0180391 A1     Jul. 28, 2011

(51) Int. Cl.
| | |
|---|---|
| C23C 14/34 | (2006.01) |
| C23C 14/06 | (2006.01) |
| C23C 14/00 | (2006.01) |
| C23C 14/02 | (2006.01) |
| C23C 14/22 | (2006.01) |
| H03H 3/007 | (2006.01) |

(52) U.S. Cl.
CPC ......... *C23C 14/0617* (2013.01); *C23C 14/0036* (2013.01); *C23C 14/02* (2013.01); *C23C 14/022* (2013.01); *C23C 14/0641* (2013.01); *C23C 14/228* (2013.01); *C23C 14/345* (2013.01); *H03H 2003/0071* (2013.01)

(58) Field of Classification Search
CPC .............. C23C 14/0641; C23C 14/228; C23C 14/0617; C23C 14/02; C23C 14/0036
USPC ............................ 204/192.12, 192.15, 192.18
See application file for complete search history.

(56) References Cited

U.S. PATENT DOCUMENTS

| | | | |
|---|---|---|---|
| 3,174,122 A | 3/1965 | Fowler et al. | |
| 3,189,851 A | 6/1965 | Fowler | |

(Continued)

FOREIGN PATENT DOCUMENTS

| | | |
|---|---|---|
| CN | 101170303 | 4/2008 |
| DE | 10239317 | 3/2004 |

(Continued)

OTHER PUBLICATIONS

Chen, "Fabrication and Characterization of ALN Thin Film Bulk Acoustic Wave Resonator" Dissertation, University of Pittsburgh School of Engineering, 2006.

(Continued)

*Primary Examiner* — Jason M Berman

(57) ABSTRACT

In accordance with a representative embodiment, a method of fabricating a piezoelectric material comprising a first component and a second component comprises: providing a substrate; flowing hydrogen over the substrate; flowing the first component to form the piezoelectric material over a target; and sputtering the piezoelectric material from the target on the substrate. In accordance with another representative embodiment, a method of fabricating a bulk acoustic wave (BAW) resonator comprises: forming a first electrode over a substrate; forming a seed layer over the substrate; and depositing a piezoelectric material having a compression-negative ($C_N$) polarity. The depositing of the piezoelectric material comprises: flowing a first component of the piezoelectric material to form the piezoelectric material over a target comprising a second component of the piezoelectric material; and sputtering the piezoelectric material from the target to the substrate.

23 Claims, 10 Drawing Sheets

(56) References Cited

U.S. PATENT DOCUMENTS

| | | |
|---|---|---|
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A * | 6/1971 | Berlincourt et al. .......... 310/321 |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,320,365 A | 11/1980 | Black et al. |
| 4,272,742 A | 6/1981 | Lewis |
| 4,281,299 A | 7/1981 | Newbold |
| 4,344,004 A | 8/1982 | Okubo |
| 4,355,408 A | 10/1982 | Scarrott |
| 4,419,202 A * | 12/1983 | Gibson .................... 204/192.16 |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,633,285 A | 12/1986 | Hunsinger et al. |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,916,520 A | 4/1990 | Kurashima |
| 4,933,743 A | 6/1990 | Thomas et al. |
| 5,006,478 A | 4/1991 | Kobayashi et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,067,959 A | 2/1992 | Omori et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,475,351 A | 12/1995 | Uematsu et al. |
| 5,548,189 A | 8/1996 | Williams |
| 5,567,334 A | 10/1996 | Baker et al. |
| 5,714,917 A | 10/1996 | Ella |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,616,208 A * | 4/1997 | Lee ........................ 156/345.24 |
| 5,633,574 A | 5/1997 | Sage |
| 5,671,242 A | 9/1997 | Takiguchi et al. |
| 5,692,279 A | 12/1997 | Mang et al. |
| 5,698,928 A | 12/1997 | Mang et al. |
| 5,704,037 A | 12/1997 | Chen |
| 5,705,877 A | 1/1998 | Shimada |
| 5,729,008 A | 3/1998 | Blalock et al. |
| 5,789,845 A | 8/1998 | Wadaka et al. |
| 5,817,446 A | 10/1998 | Lammert |
| 5,825,092 A | 10/1998 | Delgado et al. |
| 5,835,142 A | 11/1998 | Nakamura et al. |
| 5,853,601 A | 12/1998 | Krishnaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 11/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,114,795 A | 5/2000 | Tajima et al. |
| 6,087,198 A | 7/2000 | Panasik |
| 6,090,687 A | 7/2000 | Merchant et al. |
| 6,099,700 A * | 8/2000 | Lee et al. .................. 204/192.18 |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |

(56) References Cited

U.S. PATENT DOCUMENTS

| | | |
|---|---|---|
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,607,934 B2 | 8/2003 | Chang et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner et al. |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson et al. |
| 7,187,254 B2 | 3/2007 | Su et al. |
| 7,199,683 B2 | 4/2007 | Liu |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 6,262,637 B1 | 7/2007 | Bradley et al. |
| 7,242,270 B2 | 7/2007 | Larson et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson et al. |
| 7,345,410 B2 | 3/2008 | Grannen et al. |
| 7,358,831 B2 | 4/2008 | Larson et al. |
| 7,367,095 B2 | 5/2008 | Larson et al. |
| 7,368,857 B2 | 5/2008 | Tanaka |
| 7,369,013 B2 | 5/2008 | Fazzio et al. |
| 7,377,168 B2 | 5/2008 | Liu |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson |
| 7,391,286 B2 | 6/2008 | Jamneala et al. |
| 7,400,217 B2 | 7/2008 | Larson et al. |
| 7,408,428 B2 | 8/2008 | Larson |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson et al. |
| 7,425,787 B2 | 9/2008 | Larson |
| 7,439,824 B2 | 10/2008 | Aigner |
| 7,463,118 B2 | 12/2008 | Jacobsen |
| 7,466,213 B2 | 12/2008 | Lobl et al. |

(56) References Cited

U.S. PATENT DOCUMENTS

| | | |
|---|---|---|
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson et al. |
| 7,576,471 B1 | 8/2009 | Solai |
| 7,602,101 B2 | 10/2009 | Hara et al. |
| 7,619,493 B2 | 11/2009 | Uno et al. |
| 7,629,865 B2 | 12/2009 | Ruby |
| 7,642,693 B2 | 1/2010 | Akiyama et al. |
| 7,655,963 B2 | 2/2010 | Sadaka et al. |
| 7,684,109 B2 | 3/2010 | Godshalk et al. |
| 7,714,684 B2 | 5/2010 | Ruby et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,889,024 B2 | 2/2011 | Bradley et al. |
| 8,188,810 B2 | 5/2012 | Fazzio et al. |
| 8,248,185 B2 | 8/2012 | Choy et al. |
| 8,283,999 B2 | 10/2012 | Elbrecht et al. |
| 8,507,919 B2 | 8/2013 | Ishikura |
| 8,575,820 B2 | 11/2013 | Shirakawa et al. |
| 8,673,121 B2 | 3/2014 | Larson et al. |
| 8,872,604 B2 | 10/2014 | Burak et al. |
| 8,930,301 B2 | 1/2015 | Traupman et al. |
| 9,136,818 B2 | 9/2015 | Burak et al. |
| 9,136,819 B2 | 9/2015 | Grannen et al. |
| 9,154,112 B2 | 10/2015 | Burak |
| 2001/0026951 A1 | 10/2001 | Vergani et al. |
| 2002/0000646 A1 | 1/2002 | Gooch et al. |
| 2002/0063497 A1 | 5/2002 | Panasik |
| 2002/0070463 A1 | 6/2002 | Chang et al. |
| 2002/0126517 A1 | 9/2002 | Matsukawa et al. |
| 2002/0140520 A1 | 10/2002 | Hikita et al. |
| 2002/0190814 A1* | 12/2002 | Yamada et al. ............. 333/187 |
| 2003/0001251 A1 | 1/2003 | Cheever et al. |
| 2003/0006502 A1 | 1/2003 | Karpman |
| 2003/0011285 A1 | 1/2003 | Ossman |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0155574 A1 | 8/2003 | Doolittle |
| 2003/0179053 A1 | 9/2003 | Aigner et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0129079 A1 | 7/2004 | Kato et al. |
| 2004/0150296 A1 | 8/2004 | Park et al. |
| 2004/0166603 A1 | 8/2004 | Carley |
| 2004/0195937 A1 | 10/2004 | Shogo Matsubara et al. |
| 2004/0257171 A1 | 12/2004 | Park et al. |
| 2005/0012716 A1 | 1/2005 | Mikulin et al. |
| 2005/0023931 A1 | 2/2005 | Bouche et al. |
| 2005/0036604 A1 | 2/2005 | Scott et al. |
| 2005/0082626 A1 | 4/2005 | Leedy |
| 2005/0093396 A1 | 5/2005 | Larson et al. |
| 2005/0093655 A1 | 5/2005 | Larson et al. |
| 2005/0093657 A1 | 5/2005 | Larson et al. |
| 2005/0093658 A1 | 5/2005 | Larson et al. |
| 2005/0167795 A1 | 8/2005 | Higashi |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0248232 A1 | 11/2005 | Itaya et al. |
| 2005/0269904 A1 | 12/2005 | Oka |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson et al. |
| 2006/0103492 A1 | 5/2006 | Feng et al. |
| 2006/0119453 A1 | 6/2006 | Fattinger et al. |
| 2006/0121686 A1 | 6/2006 | Wei et al. |
| 2006/0125489 A1 | 6/2006 | Feucht et al. |
| 2006/0132262 A1 | 6/2006 | Fazzio et al. |
| 2006/0160353 A1 | 7/2006 | Gueneau de Mussy et al. |
| 2006/0164183 A1 | 7/2006 | Tikka et al. |
| 2006/0164186 A1 | 7/2006 | Stoemmer et al. |
| 2006/0197411 A1 | 9/2006 | Hoen et al. |
| 2006/0238070 A1 | 10/2006 | Costa et al. |
| 2006/0284707 A1 | 12/2006 | Larson et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0085213 A1 | 4/2007 | Anh et al. |
| 2007/0085632 A1 | 4/2007 | Larson et al. |
| 2007/0086080 A1 | 4/2007 | Larson et al. |
| 2007/0086274 A1 | 4/2007 | Nishimura et al. |
| 2007/0090892 A1 | 4/2007 | Larson |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2008/0055020 A1 | 3/2008 | Handtmann et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milson et al. |
| 2010/0013573 A1 | 1/2010 | Umeda |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzien et al. |
| 2010/0148637 A1 | 7/2010 | Satou |
| 2010/0176899 A1 | 7/2010 | Schaufele et al. |
| 2010/0180391 A1 | 7/2010 | Larson et al. |
| 2010/0187948 A1 | 7/2010 | Sinha et al. |
| 2010/0187949 A1 | 7/2010 | Sinha et al. |
| 2010/0260453 A1 | 10/2010 | Block |
| 2010/0327994 A1 | 12/2010 | Choy et al. |
| 2012/0218056 A1 | 2/2011 | Burak |
| 2012/0218055 A1 | 3/2011 | Burak et al. |
| 2011/0092067 A1 | 4/2011 | Bonilla et al. |
| 2011/0121689 A1 | 5/2011 | Grannen et al. |
| 2011/0180391 A1 | 7/2011 | Larson et al. |
| 2011/0204997 A1 | 8/2011 | Elbrecht et al. |
| 2011/0266917 A1 | 11/2011 | Metzger et al. |
| 2012/0177816 A1 | 7/2012 | Larson et al. |
| 2012/0248941 A1 | 10/2012 | Shirakawa et al. |
| 2012/0326807 A1 | 12/2012 | Choy et al. |
| 2013/0003377 A1 | 1/2013 | Sakai et al. |
| 2013/0106534 A1 | 5/2013 | Burak et al. |
| 2013/0127300 A1 | 5/2013 | Umeda et al. |
| 2013/0221454 A1 | 8/2013 | Dunbar et al. |
| 2013/0334625 A1 | 12/2013 | Lin |
| 2014/0118089 A1 | 5/2014 | Bradley et al. |
| 2014/0132117 A1 | 5/2014 | Larson et al. |
| 2015/0311046 A1 | 10/2015 | Yeh et al. |

FOREIGN PATENT DOCUMENTS

| | | |
|---|---|---|
| EP | 231892 | 8/1987 |
| EP | 0637875 | 2/1995 |
| EP | 0689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |

(56) References Cited

FOREIGN PATENT DOCUMENTS

| | | |
|---|---|---|
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 359023612 | 2/1984 |
| JP | 61054686 | 3/1986 |
| JP | 62109419 | 5/1987 |
| JP | 62200813 | 9/1987 |
| JP | 1295512 | 11/1989 |
| JP | 210907 | 1/1990 |
| JP | 06005944 | 1/1994 |
| JP | 8330878 | 12/1996 |
| JP | 09027729 | 1/1997 |
| JP | 983029 | 3/1997 |
| JP | 1032456 | 2/1998 |
| JP | 10173479 | 6/1998 |
| JP | 2000031552 | 1/2000 |
| JP | 2000232334 | 8/2000 |
| JP | 2000295065 | 10/2000 |
| JP | 2000332568 | 11/2000 |
| JP | 2001102901 | 4/2001 |
| JP | 2001508630 | 6/2001 |
| JP | 2002217676 | 8/2002 |
| JP | 2003017964 | 1/2003 |
| JP | 2003017974 | 1/2003 |
| JP | 2003505905 | 2/2003 |
| JP | 2003505906 | 2/2003 |
| JP | 2000076295 | 3/2003 |
| JP | 2003124779 | 4/2003 |
| JP | 2003332872 | 11/2003 |
| JP | 2006109472 | 4/2006 |
| JP | 2006295924 | 10/2006 |
| JP | 2006319796 | 11/2006 |
| JP | 2007006501 | 1/2007 |
| JP | 2007028669 | 2/2007 |
| JP | 2007295306 | 11/2007 |
| KR | 20030048917 | 6/2003 |
| KR | 100806504 | 2/2008 |
| WO | WO9816957 | 4/1998 |
| WO | WO9838736 | 9/1998 |
| WO | WO9856049 | 12/1998 |
| WO | WO9937023 | 7/1999 |
| WO | WO0106646 | 1/2001 |
| WO | WO0106647 | 1/2001 |
| WO | WO0199276 | 12/2001 |
| WO | WO02103900 | 12/2002 |
| WO | WO03030358 | 4/2003 |
| WO | WO03043188 | 5/2003 |
| WO | WO03050950 | 6/2003 |
| WO | WO03058809 | 7/2003 |
| WO | WO2004034579 | 4/2004 |
| WO | WO2004051744 | 6/2004 |
| WO | WO2004102688 | 11/2004 |
| WO | WO2005043752 | 5/2005 |
| WO | WO2005043753 | 5/2005 |
| WO | WO2005043756 | 5/2005 |
| WO | WO2006018788 | 2/2006 |

OTHER PUBLICATIONS

Martin, et al. "Re-growth of c-axis oriented AIN thin films", IEEE Ultrasonics Symposium, 2006, p. 169-172.

Martin, et al. "Shear Mode Coupling and Tilted Gram Growth of AIN Thin Films in BAW Resonators", IEEE Transactions on Ultrasonics, Ferroelectrics, and Frequency Control, Jul. 2006, p. 1339-1343, vol. 53, No. 7.

Co-pending Application No. 13/161,946, filed Jun. 16, 2011.
Machine Translation of JP2003505905 published Feb. 12, 2003.
Machine Translation of JP2003505906 published Feb. 12, 2003.
Machine Translation of WO2004034579 published Apr. 22, 2004.
Machine Translation of WO2004102688 published Nov. 25, 2004.
Machine Translation of JP2006109472 published Apr. 20, 2006.
Machine Translation of JP2006295924 published Oct. 26, 2006.
Machine Translation of JP2007028669 published Feb. 1, 2007.
Machine Translation of JP2007006501 published Jan. 11, 2007.
Machine Translation of JP2006319796 published Nov. 11, 2006.
Machine Translation of JP2007295306 published Nov. 8, 2007.
Machine Translation of WO9838736 published Sep. 3, 1998.
Machine Translation of JP983029 published Mar. 28, 1997.
Machine Translation of JP8330878 published Dec. 13, 1996.
A partial copy of GB search report for Application No. GB0525884.3 Feb. 2, 2006, 4 pages.
British search report Application No. GB0605222.9 Jul. 11, 2006.
Examination report corresponding to application No. GB0605770.7 Aug. 25, 2006.
Examination report from UK for application GB0605971.1 Aug. 24, 2006.
Search report for Great Britain patent application No. 0617742.2 Dec. 13, 2006.
Search report for Great Britain Patent Application No. 0617742.2 Mar. 29, 2007.
Search report from corresponding application No. GB0605225.2 Jun. 26, 2006.
Search report from Corresponding Application No. GB0620152.9 Nov. 15, 2006.
Search report from Corresponding Application No. GB0620653.6 Nov. 17, 2006.
Search report from Corresponding Application No. GB0620655.1 Nov. 17, 2006.
Search report from Corresponding Application No. GB0620657.7 Nov. 23, 2006.
Examination report from Corresponding Application No. GB0605779.8 Aug. 23, 2006.
Search report in the Great Britain Patent Application No. GB0619698.4 Nov. 30, 2006.
Akiyama, et al., "Enhancement of Piezoelectric Response in Scandium Aluminum Nitride Alloy Thin Films Prepared by Dual Reactive Cosputtering", Advanced Materials, vol. 21, 2009, pp. 593-596.
Al-Ahmad, et al., "Piezoelectric-Based Tunable Microstrip Shunt Resonator", Proceedings of Asia-Pacific Microwave Conference, 2006.
Aoyama, et al., "Diffusion of Boron, Phosphorus, Arsenic and Antimony in Thermally Grown SiliconDioxide", Journal of Electrochemical Society, vol. 146 (5), pp. 1879-1883, 1999.
Auld, "Acoustic Resonators", Acoustic Fields and Waves in Solids, Second Edition, vol. 2, 1990, pp. 250-259.
Bauer, et al., "Properties of Silicon Implanted with Boron Ions through Thermal Silicon Dioxide", Solid State Electronics, vol. 16, No. 3, 1973, pp. 289-300.
Bi, et al., "Bulk Acoustic Wave RF Technology", IEEE Microwave Magazine, vol. 9, Issue 5, 2008, pp. 65-80.
Choi, et al., "Design of Half-Bridge Piezo-Transformer Converters in the AC Adapter Applications", APEC 2005, IEEE, Mar. 2005, pp. 244-248.
Coombs, "Electronic Instrument Handbook", Second Edition, McGraw-Hill Inc., 1995, pp. 5.1-5.29.
C-S Lee, et al., "Copper-Airbridged Low-Noise GaAs PHEMT with Ti/Wnx/Ti Diffusion Barrier for High-Frequency Applications" IEEE Transactions on Electron Devices, vol. 53, Issue 8, 2006, pp. 1753-1758.
Denisse, et al., "Plasma-Enhanced Growth and Composition of Silicon Oxynitride Films", Journal of Applied Physics, vol. 60, No. 7, Oct. 1, 1986, pp. 2536-2542.

(56) References Cited

OTHER PUBLICATIONS

Fattinger, et al., "Coupled Bulk Acoustic Wave Resonator Filters: Key technology for single-to-balanced RF filters", IEEE MTT-S Digest, 2004, pp. 927-929.
Fattinger, et al., "Single-to-balance Filters for Mobile Phones Using Coupled Resonator BAW Technology", 2004 IEEE Ultrasonics Symposium, Aug. 2004, pp. 416-419.
Fattinger, et al., "Spurious Mode Suppression in Coupled Resonator Filters", IEEE MTT-S International Microwave Symposium Digest, 2005, pp. 409-412.
Gilbert, "An Ultra-Miniature, Low Cost Single Ended to Differential Filter for ISM Band Applications", Microwave Symposium Digest, 2008 IEEE MTT-S, Jun. 2008, pp. 839-842.
Grill, et al., "Ultralow-K Dielectrics Prepared by Plasma-Enhanced Chemical Vapor Deposition", Applied Physics Letters, vol. 79, 2001, pp. 803-805.
Hadimioglu et al., "Polymer Films as Acoustic Matching Layers", 1990 IEEE Ultrasonics Symposium Proceedings, vol. 3, Dec. 1990, pp. 1337-1340.
Hara, "Surface Treatment of Quartz Oscillator Plate by Ion Implantation", Oyo Buturi, vol. 47, No. 2, Feb. 1978, pp. 145-146.
Holzlohner et al., "Accurate Calculation of Eye Diagrams and Bit Error Rates in Optical Transmission Systems Using Linearization", Journal of Lightwave Technology, vol. 20, No. 3, Mar. 2002, pp. 389-400.
Ivensky, et al., "A Comparison of Piezoelectric Transformer AC/DC Converters with Current Doubler and voltage Doubler Rectifiers", IEEE Transactions on Power Electronics, vol. 19, No. 6, Nov. 2004.
Jamneala, et al., "Coupled Resonator Filter with Single-Layer Acoustic Coupler", IEEE Transaction on Ultrasonics, Ferroelectrics, and Frequency Control, vol. 55, Oct. 2008, pp. 2320-2326.
Jamneala, et al., "Ultra-Miniature Coupled Resonator Filter with Single-Layer Acoustic Coupler", IEEE Transactions on Ultrasonics, Ferroelectrics, and Frequency Control, vol. 56, No. 11, Nov. 2009, pp. 2553-2558.
Jiang, et al., "A Novel Single-Phase Power Factor Correction Scheme", IEEE, 1993, pp. 297-292.
Jung, et al., "Experimental and Theoretical Investigation on the Relationship Between AlN Properties and AlN-Based FBAR Characteristics", 2003 IEEE International Frequency Control Symposium and PDA Exhibition Jointly with the 17th European Frequency and Time Forum Sep. 3, 2003, pp. 779-784.
Kaitila, et al., "Measurement of Acoustical Parameters of Thin Films", 2006 IEEE Ultrasonics Symposium, Oct. 2006, pp. 464-467.
Spangenberg et al., "Dependence of the Layer of Resistance of Boron Implantation in Silicon and the Annealing Conditions", Comptus Rendus de l'Academic Bulgares des Sciences, vol. 33, No. 3, 1980, pp. 325-327.
Tas, et al., "Reducing Anchor Loss in Micromechanical Extensional Mode Resonators", IEEE Transactions on Ultrasonics, Ferroelectrics and Frequency Control, vol. 57, No. 2, Feb. 2010, pp. 448-454.
Thomsen, et al., "Surface Generation and Detection of Phonons by Picosecond Light Pulses", Physical Review B, vol. 34, No. 6, Sep. 15 1986, pp. 4129-4138.
Tiersten, et al., "An Analysis of Thickness-Extensional Trapped Energy Resonant Device Structures with Rectangular Electrodes in the Piezoelectric Thin Film on Silicon Configuration", Journal of Applied Physics, 54 (10), Oct. 1983, pp. 5893-5910.
Topich, et al., "Effects of Ion Implanted Fluorine in Silicon Dioxide", Nuclear Instr. And Methods, Cecon Rec, Cleveland OH, May 1978, pp. 70-73.
Tsubbouchi, et al., "Zero Temperature coefficient Surface Acoustic Wave Devices using Epitaxial AlN Films", IEEE Ultrasonics Symposium, San Diego CA, 1982, pp. 240-245.
Vasic, et al., "A New Method to Design Piezoelectric Transformer Used in MOSFET & IGBT Drive Circuits", IEEE 34th Annual Power Electronics Specialists Conference, 2003, vol. 1, Jun. 15-19, 2003, pp. 307-312.
Vasic, et al., "A New MOSFET & IGBT Gate Drive Insulated by a Piezoelectric Transformer", IEEE 32nd Annual Power Electronics Specialists Conference, vol. 3, 2001, pp. 1479-1484.
Yanagitani, et al., "Giant Shear Mode Electromechanical Coupling Coefficient k15 in C-Axis Tilted ScAlN Films", IEEE International Ultrasonics Symposium, Oct. 2010, pp. 2095-2098.
Yang, et al., "Highly C Axis Oriented AlN Film Using Mocvd for 5GHx Band FBAR Filter", 2003 IEEE Ultrasonics Symposium, Oct. 5, 2003, pp. 170-173.
Pensala, et al., "Spurious resonance suppression in gigahertz-range ZnO thin-film bulk acoustic wave resonators by the boundary frame method:modeling and experiment", IEEE Transactions on Ultrasonics, Ferroelectrics, and Frequency Control, vol. 56, No. 8, Aug. 2009, pp. 1731-1744.
Lynch, "Precise Measurements on Dielectric and Magnetic Materials", IEEE Transactions on Instrumentation and Measurement, vol. IM-23, No. 4, Dec. 1974, pp. 425-431.
Ranjan, et al., "Strained Hexagonal ScN: A Material with Unusual Structural and Optical Properties", Physical Review Letters, vol. 90, No. 25, Jun. 27, 2003.
Farrer, et al., "Properties of Hexagonal ScN versus wurtzite GaN and InN", Physical Review B 66, Nov. 20, 2002.
Constantin, et al., "Composition-dependent structural properties in ScGaN alloy films: a combined experimental and theoretical study", Journal of Applied Physics, vol. 98, Dec. 16, 2005.
Suzuki, et al., "Influence of shadowing effect on shear mode acoustic properties in the c-axis tilted AI films", IEEE Ultrasonics Symposium, Oct. 2010, pp. 1478-1481.
Krishnaswamy, et al., "Film Bulk Acoustic Wave Resonator Technology", 1990 Ultrasonics Symposium, May 29, 1990, pp. 529-536.
Machine translation of JP2003332872 published Nov. 21, 2003.
A partial copy of GB search report for Application No. GB0522393.8 Jan. 9, 2006, 4 pages.
Lakin, "Bulk Acoustic Wave Coupled Resonator Filters", 2002 IEEE International Frequency Control Symposium and PDA Exhibition, May 2002, pp. 8-14.
Machine translation of KR20030048917 published Jun. 25, 2003.
Machine translation of WO9937023 published Jul. 22, 1999.
Machine translation of CN101170303 published Apr. 30, 2008.
Machine translation of WO03030358 published Apr. 10, 2003.
Machine translation of WO03043188 published May 22, 2003.
Machine translation of WO03050950 published Jun. 19, 2003.
Machine translation of DE10239317 published Mar. 11, 2004.
Machine translation of JP2000232334 published Aug. 22, 2000.
Machine translation of JP2000295065 published Oct. 20, 2000.
Machine translation of JP2000031552 published Jan. 28, 2000.
Machine translation of JP2000332568 published Nov. 30, 2000.
Machine translation of JP2001102901 published Apr. 13, 2001.
Machine translation of JP2001508630 published Jun. 26, 2001.
Machine translation of JP2002217676 published Aug. 2, 2002.
Machine translation of JP2003017964 published Jan. 17, 2003.
Machine translation of JP2003124779 published Apr. 25, 2003.
Machine translation of JP2003017974 published Jan. 17, 2003.
Machine Translation of KR100806504 published Feb. 21, 2008.
Machine Translation of WO02103900 published Dec. 27, 2002.
Machine Translation of JP10173479 published Jun. 26, 1998.
Machine Translation of KR20020050729 published Jun. 27, 2002.
Machine Translation of JP2000076295 published Mar. 14, 2003.
Lakin, "Coupled Resonator Filters", 2002 IEEE Ultrasonics Symposium, Mar. 2, 2002, pp. 901-908.
Lakin, et al., "High Performance Stacked Crystal Filters for GPS and Wide Bandwidth Applications", 2001 IEEE Ultrasonics Symposium, Jan. 1, 2001, pp. 833-838.
Lakin, et al., "Temperature Compensated Bulk Acoustic Thin Film Resonators", 2000 IEEE Ultrasonics Symposium San Juan Puerto Rico, Oct. 2000, pp. 855-858.
Lakin, "Thin Film BAW Filters for Wide Bandwidth and High Performance Applications", IEEE Microwave Symposium Digest, 2004 MTT-S International, vol. 2, Jun. 6-11 2004, pp. 923-926.
Lakin, "Thin Film Resonators and Filters", IEEE Ultrasonics Symposium, Caesar's Tahoe, NV, vol. 2, Oct. 1999, pp. 895-906.

(56) References Cited

OTHER PUBLICATIONS

Lakin, et al., "Wide Bandwidth Thin Film BAW Filters", 2004 IEEE Ultrasonics, Ferroelectrics, and Frequemcy Control Joint 50th Anniversary Conference, vol. 1, Aug. 2004, pp. 407-410.

Larson, et al., "*Measurement of Effective Kt2,Q,Rp,Rs vs. Temperature for Mo/AlN FBAR Resonators*", IEEE Ultrasonics Symposium, 2002, pp. 939-943.

Lee, et al., "Optimization of Frame-Like Film Bulk Acoustic Resonators for Suppression of Spurious Lateral Modes Using Finite Element Method", IEEE Ultrasonics Symposium, vol. 1, 2004, pp. 278-281.

Li, et al., "AC-DC Converter with Worldwide Range Input Voltage by Series and Parallel Piezoelectric Transformer Connection", 35th Annual IEEE Power Electronics Specialists Conference, 2004, pp. 2668-2671.

Lobl, et al., "Piezoelectric Materials for BAW Resonators and Filters", 2001 IEEE Ultrasonics Symposium, Jan. 1, 2001, pp. 807-811.

Loboda, "New Solutions for Intermetal Dielectrics Using Trimethylsilane-Based PECVD Processes", Microelectronics Eng., vol. 50, 2000, pp. 15-23.

Martin, et al., "Development of a Low Dielectric Constant Polymer for the Fabrication of Integrated Circuit Interconnect", IEEE Transactions on Ultrasonics, Ferroelectrics, and Frequency Control, vol. 53, No. 7, Jul. 2006, pp. 1339-1343.

Martinez, et al., "High confinement suspended micro-ring resonators in silicon-on-insulator", Optics Express, vol. 14, No. 13, Jun. 26, 2006, pp. 6259-6263.

Navas, et al., "Miniaturised Battery Charger using Piezoelectric Transformers", Applied Power Electronics Conference and Exposition, 2001 Sixteenth Annual IEEE, vol. 1, pp. 492-496.

Ng, et al., "The Diffusion Ion-Implanted Boron in Silicon Dioxide", AIP Conf. Proceedings, No. 122, 1984, pp. 20-33.

Ohta, et al., "Temperature Characteristics of Solidly Mounted Piezoelectric Thin Film Resonators", IEEE Ultrasonics Symposium, Honolulu HI, Oct. 2003, pp. 2011-2015.

Pandey, et al., "Anchor Loss Reduction in Resonant MEMS using MESA Structures", Proceedings of the 2nd IEEE International Conference on Nano/Micro Engineered and Molecular Systems, Bangkok Thailand, Jan. 16-19, 2007, pp. 880-885.

Pang, et al., "High Q Single-Mode High-Tone Bulk Acoustic Resonator Integrated with Surface-Machined FBAR Filter", Microwave Symposium Digest, IEEE MTT-S International, 2005, pp. 413-416.

Parker, et al., "Temperature-Compensated Surface Acoustic-Wave Devices with SiO2 Film Overlays", Journal of Applied Physics, vol. 50, Mar. 1979, pp. 1360-1369.

Pensala, "Thin film bulk acoustic wave devices: performance optimization and modeling", http://www.vtt.fi/inf/pdf/publications/2011/P756.pdf.

Reinhardt, et al., "Design of Coupled Resonator Filters Using Admittance and Scattering Matrices", 2003 IEEE Ultrasonics Symposium, May 3, 2003, pp. 1428-1431.

Ruby, "MicroMachined Thin Film Bulk Acoustic Resonators", IEEE Internation Frequency Control Symposium, 1994, pp. 135-138.

Ruby, et al., "The Effect of Perimeter Geometry on FBAR Resonator Electrical Performance", Microwave Symposium Digest, 2005 IEEE MTT-S International, Jun. 12, 2005, pp. 217-221.

Sanchez, et al., "Mixed Analytical and Numerical Design Method for Piezoelectric Transformers", IEEE Xplore, 2003, pp. 841-846.

Schoenholz, et al., "Plasma-Enhanced Deposition of Silicon Oxynitride Films", Thin Solid Films, 1987, pp. 285-291.

Schuessler, "Ceramic Filters and Resonators", Reprinted from IEEE Trans Sonics Ultrason., vol. SU-21, Oct. 1974, pp. 257-268.

Shirakawa, et al., "Bulk Acoustic Wave Coupled Resonator Filters Synthesis Methodology", 2005 European Microwave Conference, vol. 1, Oct. 2005.

Small, et al., "A De-Coupled Stacked Bulk Acoustic Resonator (DSBAR) Filter with 2 dB Bandwidth >4%", 2007 IEEE Ultrasonics Symposium, Oct. 2007, pp. 604-607.

\* cited by examiner

METHOD OF FABRICATING PIEZOELECTRIC MATERIAL WITH SELECTED C-AXIS ORIENTATION

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator includes an acoustic stack comprising, inter alia, a layer of piezoelectric material disposed between two electrodes. Acoustic waves achieve resonance across the acoustic stack, with the resonant frequency of the waves being determined by the materials in the acoustic stack. One type of BAW resonator comprises a piezoelectric film for the piezoelectric material. These resonators are often referred to as Film Bulk Acoustic Resonators (FBAR).

FBARs are similar in principle to bulk acoustic resonators such as quartz, but are scaled down to resonate at GHz frequencies. Because the FBARs have thicknesses on the order of microns and length and width dimensions of hundreds of microns. FBARs beneficially provide a comparatively compact alternative to certain known resonators.

FBARs may comprise a membrane (also referred to as the acoustic stack) disposed over air. Often, such a structure comprises the membrane suspended over a cavity provided in a substrate over which the membrane is suspended. Other FBARs may comprise the membrane formed over an acoustic mirror formed in the substrate. Regardless of whether the membrane is formed over air or over an acoustic mirror, the membrane comprises a piezoelectric layer disposed over a first electrode, and a second electrode disposed over the piezoelectric layer.

The piezoelectric layer comprises a crystalline structure and a polarization axis. Piezoelectric materials either compress or expand upon application of a voltage. By convention, a piezoelectric material that compresses when a voltage of a certain polarity is applied is referred to as compression-positive ($C_P$) material, whereas a piezoelectric material that expands upon application of the voltage is referred to as a compression-negative ($C_N$) material. The polarization axis of $C_P$ piezoelectric materials is antiparallel to the polarization axis $C_N$ material.

An FBAR is a polarity-dependent device as a result of polarity dependence of the piezoelectric material that constitutes part of the FBAR. A voltage of a given polarity applied between the electrodes of the FBAR will cause the thickness of the FBAR to change in a first direction, whereas the same voltage of the opposite polarity will cause the thickness of the FBAR to change in a second direction, opposite the first direction. (The thickness of the FBAR is the dimension of the FBAR between the electrodes.) For example, a voltage of the given polarity will cause the thickness of the FBAR to increase whereas a voltage of the opposite polarity will cause the FBAR to decrease. Similarly, a mechanical stress applied to the FBAR that causes the thickness of the FBAR to change in a first direction will generate a voltage of the given polarity between the electrodes of the FBAR, whereas a mechanical stress that causes the thickness of the FBAR to change in a second direction, opposite the first direction, will generate a voltage of the opposite polarity between the electrodes of the FBAR. As such, a mechanical stress applied to the FBAR that causes the thickness of the FBAR to increase will generate a voltage of the given polarity, whereas a mechanical stress that causes the thickness of the FBAR to decrease will generate a voltage of the opposite polarity.

The piezoelectric layer of an FBAR is often grown over a first electrode and beneath a second electrode. The orientation of the C-axis can be governed by the first layer formed over the first electrode. For example, in growing aluminum nitride (AlN) with a $C_P$ film orientation, the formation of a native oxide layer over the first electrode (e.g., Mo) is believed to cause the first layer of the piezoelectric crystal to be Al. Ultimately, the crystalline orientation of the AlN formed results in piezoelectric film's having $C_P$ orientation and its attendant properties. Growth of $C_N$ piezoelectric layers (e.g., AlN) by known methods has proven to be more difficult. It is believed that nitrogen and oxygen may be adsorbed at the surface of the first electrode, with the forming of a layer of Al over this adsorbed material. As such, rather than forming the desired $C_N$ piezoelectric layer, $C_P$ piezoelectric material is formed.

In certain applications, it is desirable to be able to select the orientation of the piezoelectric material, and to fabricate both $C_P$ piezoelectric material and $C_N$ piezoelectric material on the same structure. For example, in certain applications it is useful to provide a single-ended input to a differential output. One known resonator structure having a differential output comprises coupled mode resonators. Filters based on coupled mode acoustic resonators are often referred to as coupled resonator filters (CRFs). CRFs have been investigated and implemented to provide improved passband and isolation of the transmit band and receive band of duplexers, for example. One topology for CRFs comprises an upper FBAR and a lower FBAR. The two electrodes of one of the FBARs comprise the differential outputs, and one of the inputs to the lower resonator provides the single-ended input. The second electrode provides the ground for the device. However, while the stacked-FBAR CRF shows promise from the perspective of improved performance and reduced area or footprint due to its vertical nature, in order to attain this structure, the orientation of the compression axes (C-axes) of individual piezoelectric materials must be tailored to the application. For example, it may be useful to have one piezoelectric layer with its C-axis (e.g., $C_N$) in one direction, and the second piezoelectric layer to have its crystalline orientation anti-parallel (e.g., $C_P$) to the C-axis of the first piezoelectric layer. Unfortunately, and as alluded to above, using known methods of fabricating piezoelectric layers, it is difficult to select the orientation of the piezoelectric crystal during fabrication, and especially on the same wafer.

What is needed, therefore, is a method of fabricating piezoelectric materials that overcomes at least the known shortcomings described above.

SUMMARY

In accordance with a representative embodiment, a method of fabricating a piezoelectric material comprising a first component and a second component comprises: providing a substrate; flowing hydrogen over the substrate; flowing the first component to form the piezoelectric material over a target; and sputtering the piezoelectric material from the target on the substrate.

In accordance with another representative embodiment, a method of fabricating a bulk acoustic wave (BAW) resonator comprises: forming a first electrode over a substrate; forming a seed layer over the substrate; depositing a piezoelectric material having a compression-negative ($C_N$) polarity, the depositing comprising: flowing a first component of the piezoelectric material to form the piezoelectric material over a target comprising a second component of the piezoelectric material; and sputtering the piezoelectric material from the target to the substrate.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
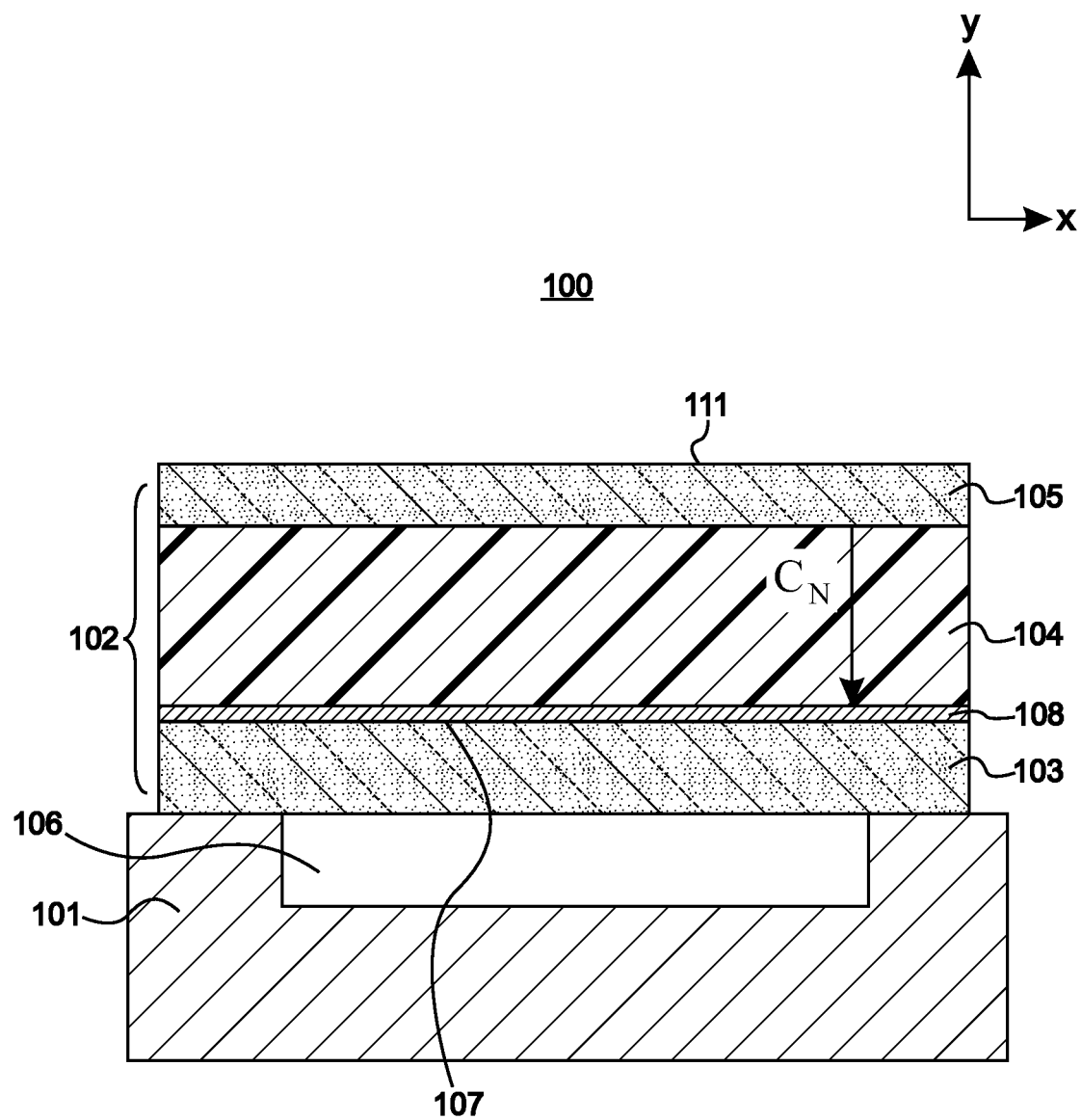
FIG. 1A shows a bulk acoustic wave (BAW) resonator fabricated in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Certain aspects of the present teachings are relevant to components of FBAR devices, FBAR-based filters, their materials and their methods of fabrication. Many details of FBARs, materials thereof and their methods of fabrication may be found in one or more of the following U.S. Patents and Patent Applications: U.S. Pat. No. 6,107,721, to Lakin; U.S. Pat. Nos. 5,587,620, 5,873,153 and 6,507,983 to Ruby, et al.; U.S. patent application Ser. No. 11/443,954, entitled "Piezoelectric Resonator Structures and Electrical Filters" to Richard C. Ruby, et al.; U.S. patent application Ser. No. 10/990,201, entitled "Thin Film Bulk Acoustic Resonator with Mass Loaded Perimeter" to Hongjun Feng, et al.; and U.S. patent application Ser. No. 11/713,726, entitled "Piezoelectric Resonator Structures and Electrical Filters having Frame Elements" to Jamneala, et al.; and U.S. patent application Ser. No. 11/159,753, entitled "Acoustic Resonator Performance Enhancement Using Alternating Frame Structure" to Richard C. Ruby, et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

Generally, the present teachings relate to a method of fabricating a piezoelectric layer comprising a selected C-axis orientation (i.e., polarity). In certain embodiments a piezoelectric material fabricated according to representative embodiments comprises a $C_N$ polarity (also referred to as type-$C_N$ piezoelectric material), whereas another piezoelectric material fabricated over the same substrate comprises a $C_P$ polarity (also referred to as type-$C_P$ piezoelectric material). In other embodiments, more than two or more piezoelectric layers are fabricated according to representative embodiments comprise $C_N$ polarity. Furthermore, in representative embodiments the piezoelectric material comprises AlN. It is emphasized that this is merely illustrative, and that the fabrication of other types of piezoelectric materials is contemplated, including but not limited to the fabrication of zinc oxide (ZnO) and lead zirconium titanate (PZT).

Applications of the illustrative methods will be appreciated by one having ordinary skill in the art. Some of these applications include FBARs useful in transformer applications and FBARs useful in filter applications. For example, the method of fabrication piezoelectric materials comprising antiparallel C-axes (e.g., $C_N$ polarity and $C_P$ polarity) may be useful on the fabrication of film acoustic transformers, such as described in commonly owned U.S. Pat. Nos. 6,987,433 and 7,091,649, to Larson, III, et al. Moreover, the method of fabrication piezoelectric materials comprising antiparallel C-axes (e.g., $C_N$ polarity and $C_P$ polarity) or parallel C-axes (e.g., both $C_N$ polarity) may be useful in the fabrication of the stacked thin film bulk acoustic resonators (SBARs). SBARs comprise stacking two or more layers of piezoelectric material with electrodes between the piezoelectric layers and on the top and bottom of the stack. Such SBARs are described, for example in commonly owned U.S. Pat. Nos. 5,587,620 and 6,060,818, to Ruby, et al. Furthermore, the method of fabricating piezoelectric materials comprising antiparallel C-axes (e.g., $C_N$ polarity and $C_P$ polarity) or both comprising $C_N$ polarity may be useful in CRF applications, such as described in commonly-owned U.S. patent application Ser. No. 12/201,641 entitled "Single Cavity Acoustic Resonators and Electrical Filters Comprising Single Cavity Acoustic Resonators" filed on Aug. 29, 2008 to Bradley, et al.; and in commonly owned U.S. Pat. No. 7,515,018 to Handtmann, et al. The disclosures of U.S. Pat. Nos. 5,587,620; 6,060,818; 6,987,433; 7,091,649; and 7,515,018 and the disclosure of U.S. patent application Ser. No. 12/201,641 are specifically incorporated herein by reference. It is emphasized that the noted applications are intended merely to illustrate applications of the methods of the present teachings, and that the application of the methods of fabricating piezoelectric materials of the present teachings are not limited to these illustrative applications.

FIG. 1A shows a simplified cross-sectional view of an FBAR 100 in accordance with a representative embodiment. An acoustic stack 102 is provided over a substrate 101 and comprises a first electrode 103 disposed over the substrate 101; a piezoelectric layer 104 disposed over the first electrode 103; and a second electrode 105 disposed over the piezoelectric layer 104. The piezoelectric layer 104 is a type-$C_N$ piezoelectric material, and is illustratively type-$C_N$ aluminum nitride (AlN). The substrate 101 illustratively comprises single-crystal silicon (Si).

A cavity 106 is formed in the substrate 101 beneath the first electrode 103 by a known method. The first electrode 103 and the second electrode 105 may be one of a variety of conductive materials, such as metals suitable as electrodes in BAW applications. Generally, materials suitable for the first electrode 103 and the second electrode 105 comprise Refractory metals. Transition metals or Noble Metals. In specific embodiments, the first and second electrodes 103, 105 illustratively comprise one or more of molybdenum (Mo), aluminum (Al), tungsten (W), platinum (Pt), ruthenium (Ru), niobium (Nb), hafnium (Hf) and uranium-238 (U-238), or other low-loss metals, and are fabricated using a known method. The piezoelectric layer 104 is fabricated in accordance with the present teachings.

In a representative embodiment, the FBAR 100 comprises a seed layer 108 disposed over an upper surface 107 of the first electrode 103. As described more fully below, the seed layer 108 is illustratively Al and fosters growth of piezoelectric layer 104 of type-$C_N$ AlN. In a representative embodiment, the seed layer 108 has a thickness in the range of approximately 50 Å to approximately 1000 Å over the upper surface 107. In other representative embodiments described below, the seed layer 108 is not provided over the first electrode 103. Rather, the type-$C_N$ piezoelectric layer 104 is formed over the upper surface 107 of the first electrode 103 by methods of representative embodiments.

Figure 1B:
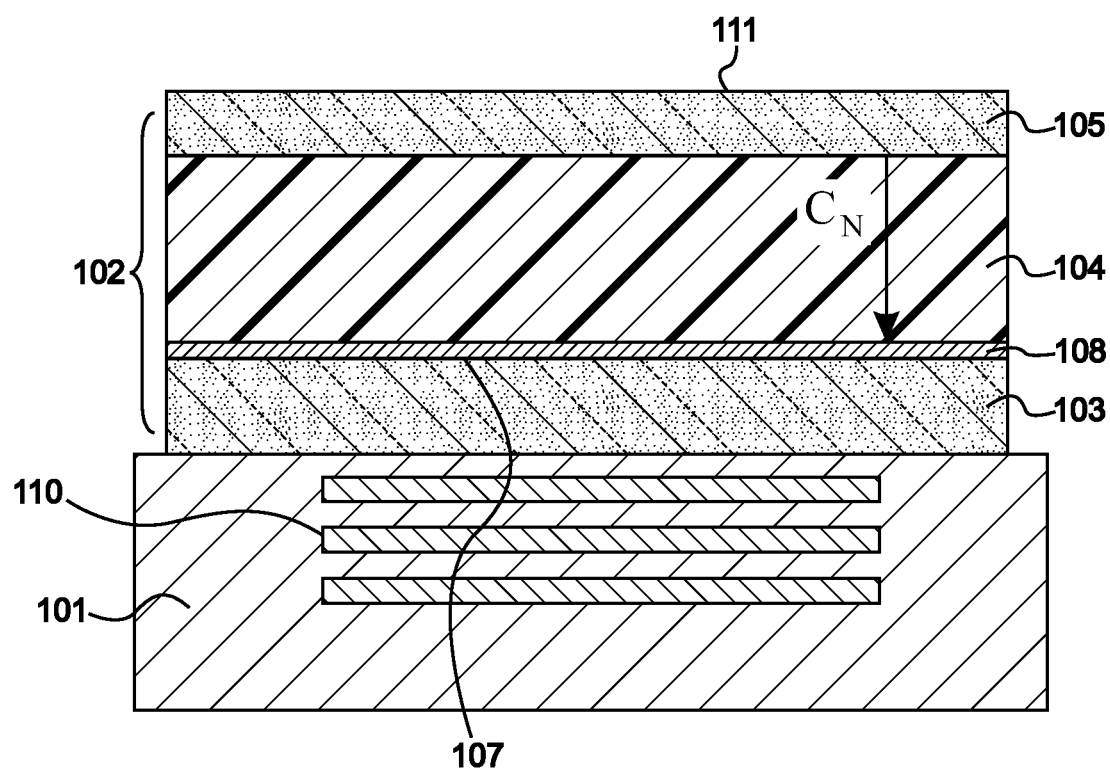
FIG. 1B shows a BAW resonator fabricated in accordance with a representative embodiment.

FIG. 1B shows a simplified cross-sectional view of an FBAR 109 in accordance with another representative embodiment. The acoustic stack 102 is provided over the substrate 101 and comprises the first electrode 103 disposed over the substrate 101; the piezoelectric layer 104 disposed over the first electrode 103; and the second electrode 105 disposed over the piezoelectric layer 104. The substrate 101 illustratively comprises single-crystal silicon (Si), and comprises an acoustic isolator 110 formed therein and disposed beneath the first electrode 103. The acoustic isolator 110 may be a known acoustic mirror comprising layers of alternating high acoustic impedance material and low impedance material. The piezoelectric layer 104 illustratively comprises AlN, and is a type-$C_N$ material fabricated in accordance with the present teachings.

In a representative embodiment, the FBAR 109 comprises the seed layer 108 disposed over an upper surface 107 of the first electrode 103. The seed layer 108 has a thickness in the range of approximately 50 Å to approximately 1000 Å over the upper surface 107. In other representative embodiments described below, the seed layer 108 is not provided over the first electrode 103. Rather, the type-$C_N$ piezoelectric layer 104 is formed over the upper surface 107 of the first electrode 103 by methods of representative embodiments.

Figure 2A:
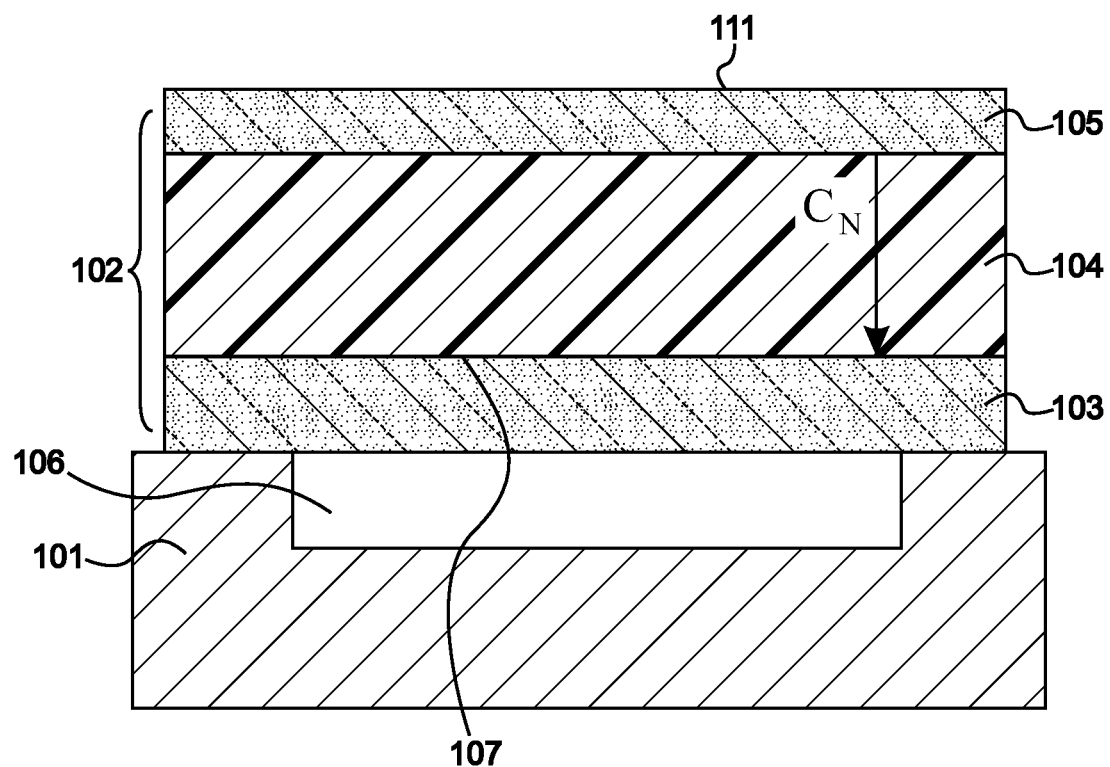
FIG. 2A shows a BAW resonator fabricated in accordance with a representative embodiment.

FIG. 2A shows a simplified cross-sectional view of an FBAR 200 in accordance with a representative embodiment. The acoustic stack 102 is provided over the substrate 101 and comprises the first electrode 103 disposed over the substrate 101; the piezoelectric layer 104 disposed over the first electrode 103; and the second electrode 105 disposed over the piezoelectric layer 104. The piezoelectric layer 104 is a type-$C_N$ piezoelectric material, and is illustratively type-$C_N$ aluminum nitride (AlN). The substrate 101 illustratively comprises single-crystal silicon (Si).

The cavity 106 is formed in the substrate 101 beneath the first electrode 103 by a known method. The first electrode 103 and the second electrode 105 may be one of a variety of conductive materials as noted above, and are fabricated using a known method. The piezoelectric layer 104 is fabricated in accordance with the present teachings.

In a representative embodiment, and unlike the FBAR 100, FBAR 200 does not comprise the seed layer 108 over the upper surface 107 of the first electrode 103. Rather, the type-$C_N$ piezoelectric layer 104 is formed over the upper surface 107 of the first electrode 103 by methods of representative embodiments described below.

Figure 2B:
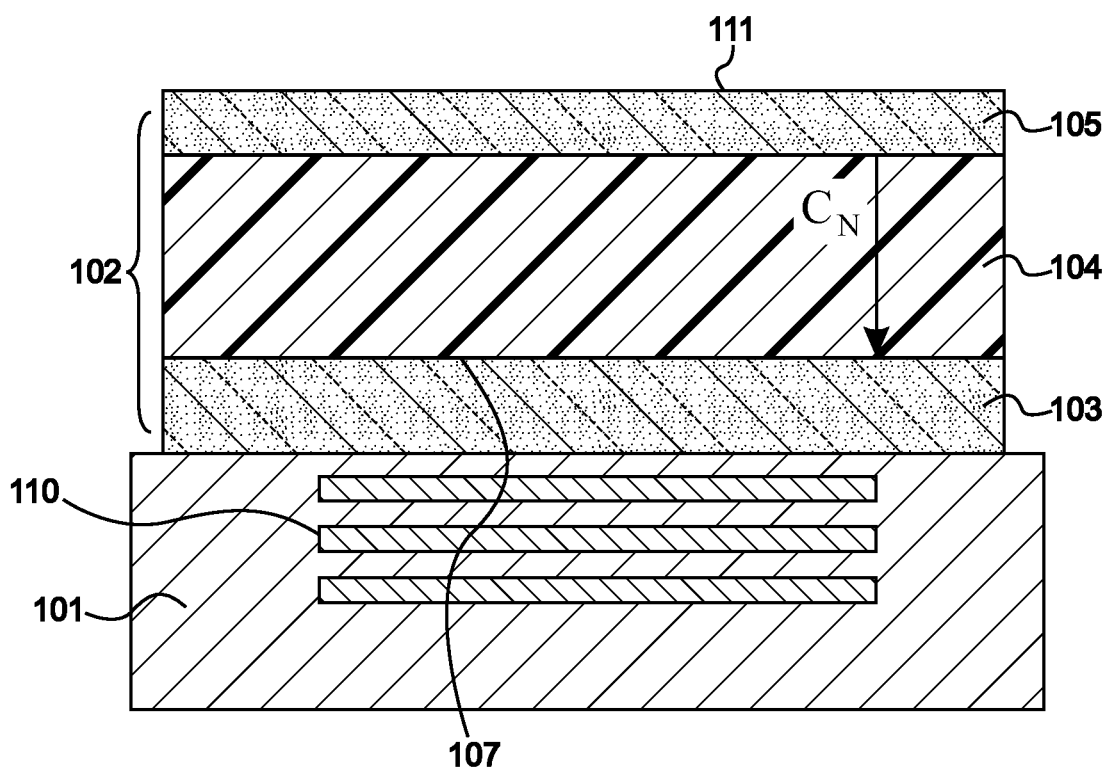
FIG. 2B shows a BAW resonator fabricated in accordance with a representative embodiment.

FIG. 2B shows a simplified cross-sectional view of an FBAR 201 in accordance with a representative embodiment. The acoustic stack 102 is provided over the substrate 101 and comprises the first electrode 103 disposed over the substrate 101; the piezoelectric layer 104 disposed over the first electrode 103; and the second electrode 105 disposed over the piezoelectric layer 104. The substrate 101 illustratively comprises single-crystal silicon (Si), and comprises the acoustic isolator 110 formed therein and disposed beneath the first electrode 103. The acoustic isolator 110 may be a known acoustic mirror comprising layers of alternating high acoustic impedance material and low impedance material. The first electrode 103 and the second electrode 105 may be one of a variety of conductive materials as noted above, and are fabricated using a known method. The piezoelectric layer 104 is fabricated in accordance with the present teachings.

In a representative embodiment, and unlike FBAR 109 shown in FIG. 1B, the FBAR 201 does not comprise the seed layer 108 over the first electrode 103. Rather, the type-$C_N$ piezoelectric layer 104 is formed over the upper surface 107 of the first electrode 103 by methods of representative embodiments described below.

Figure 3A:
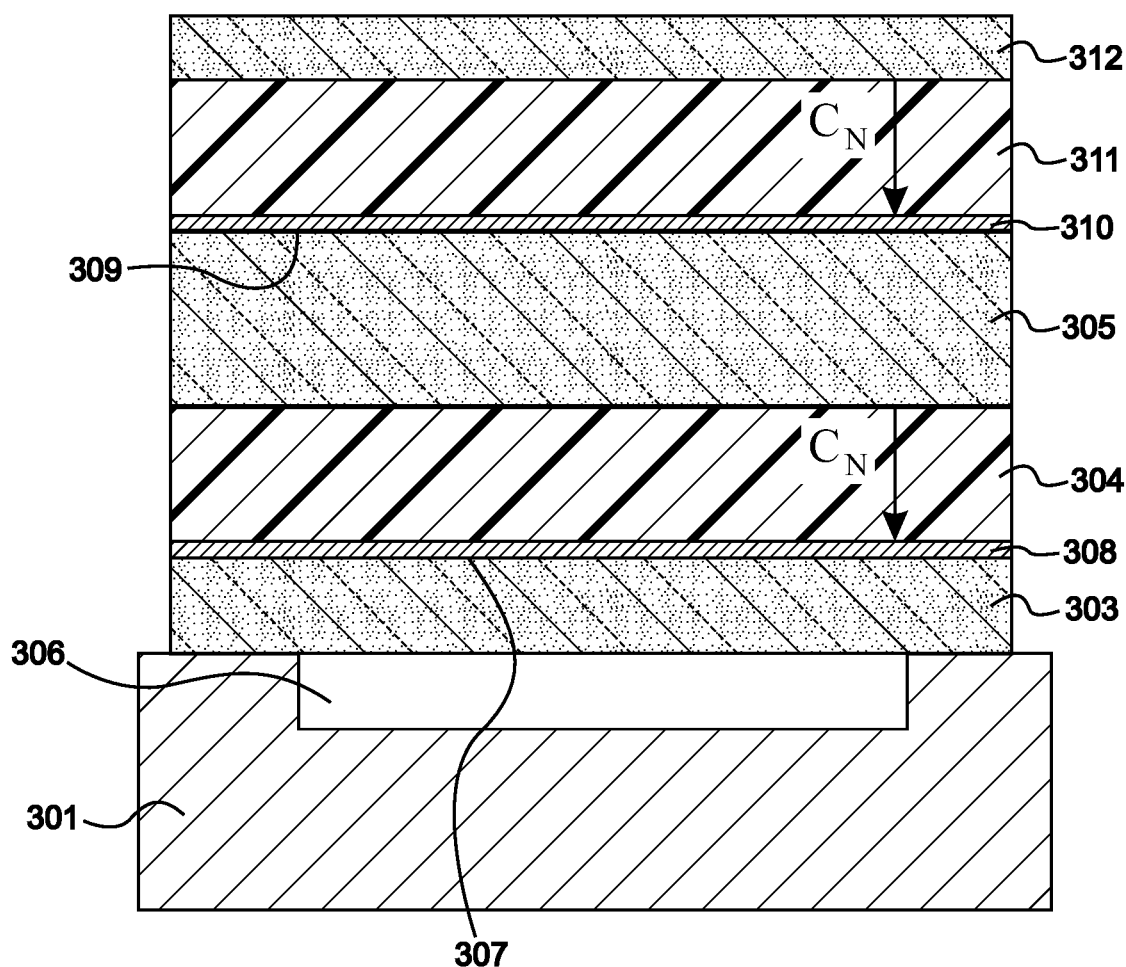
FIG. 3A shows a BAW resonator fabricated in accordance with a representative embodiment.

FIG. 3A shows a simplified cross-sectional view of a BAW resonator 300 in accordance with a representative embodiment. The BAW resonator 300 comprises a single cavity such as described in commonly-owned U.S. patent application Ser. No. 12/201,641 to Bradley, et al. The BAW resonator 300 comprises a first electrode 303 disposed over a substrate 301; a first piezoelectric layer 304 disposed over the first electrode 303; and a second electrode 305 disposed over the first piezoelectric layer 304. In the representative embodiment, the first piezoelectric layer 304 is a type-$C_N$ piezoelectric material, and is illustratively type-$C_N$ aluminum nitride (AlN). The substrate 301 illustratively comprises single-crystal silicon (Si).

A second piezoelectric layer 311 is disposed over the second electrode 305; and a third electrode 312 is disposed over the second piezoelectric layer 311. The second piezoelectric layer 311 is a type-$C_N$ piezoelectric material, and is illustratively type-$C_N$ aluminum nitride (AlN). A cavity 306 is formed in the substrate 301 beneath the first electrode 303 by a known method. The cavity 306 provides acoustic isolation as described above. Alternatively, an acoustic isolator (not shown in FIG. 3A) such as described above and comprising alternating layers of comparatively high and low acoustic impedance may be used instead of the cavity 306.

The first electrode 303, the second electrode 305 and the third electrode 312 may be one of a variety of conductive materials, such as metals suitable as electrodes in BAW applications. Generally, materials suitable for the first electrode 103 and the second electrode 105 comprise Refractory metals, Transition metals or Noble Metals. In specific embodiments, the first and second electrodes 103, 105 illustratively comprise one or more of molybdenum (Mo), aluminum (Al), tungsten (W), platinum (Pt), ruthenium (Ru), niobium (Nb), hafnium (Hf) and uranium-238 (U-238), or other low-loss metals, and are fabricated using a known method. The piezoelectric layer 104 is fabricated in accordance with the present teachings.

In a representative embodiment, the FBAR 300 comprises a first seed layer 308 disposed over an upper surface 307 of the first electrode 303; and a second seed layer 310 disposed over an upper surface 309 of the second electrode 305. As described more fully below, the first and second seed layers 308, 310 are illustratively Al and foster growth of the first and second piezoelectric layers 304, 311 both of type-$C_N$ AlN. In a representative embodiment, the first and second seed layers 308, 310 each have a thickness in the range of approximately 50 Å to approximately 1000 Å.

It is appreciated that the FBAR 300 of the representative embodiment comprises an acoustic stack comprising more than one type $C_N$ piezoelectric layer. It is emphasized that other BAW resonator structures comprising an acoustic stack comprising more than one type $C_N$ piezoelectric layer are contemplated. For example, decoupled stacked acoustic resonators comprising more than one FBAR with an acoustic decoupler disposed therebetween are contemplated. In such an embodiment, each of the FBARs would include a type $C_N$ piezoelectric layer fabricated in accordance with the present teachings. The present teachings contemplate forming the piezoelectric layers with $C_N$ axes by providing a seed layer over a surface of respective electrodes and forming the respective piezoelectric layer thereover.

Furthermore, in certain BAW structures comprising an acoustic resonator comprising more than one piezoelectric layer, it is desirable to provide piezoelectric layers comprising anti-parallel C-axes (e.g., one type $C_N$ piezoelectric layer, and one type $C_P$ piezoelectric layer). The present teachings also contemplate forming the piezoelectric layers with $C_N$ axes by providing a seed layer over the surface of an electrode, forming the type $C_N$ piezoelectric layer over the seed layer and forming a type $C_P$ piezoelectric layer over another electrode. The type $C_P$ piezoelectric layer is formed using a known method.

Figure 3B:
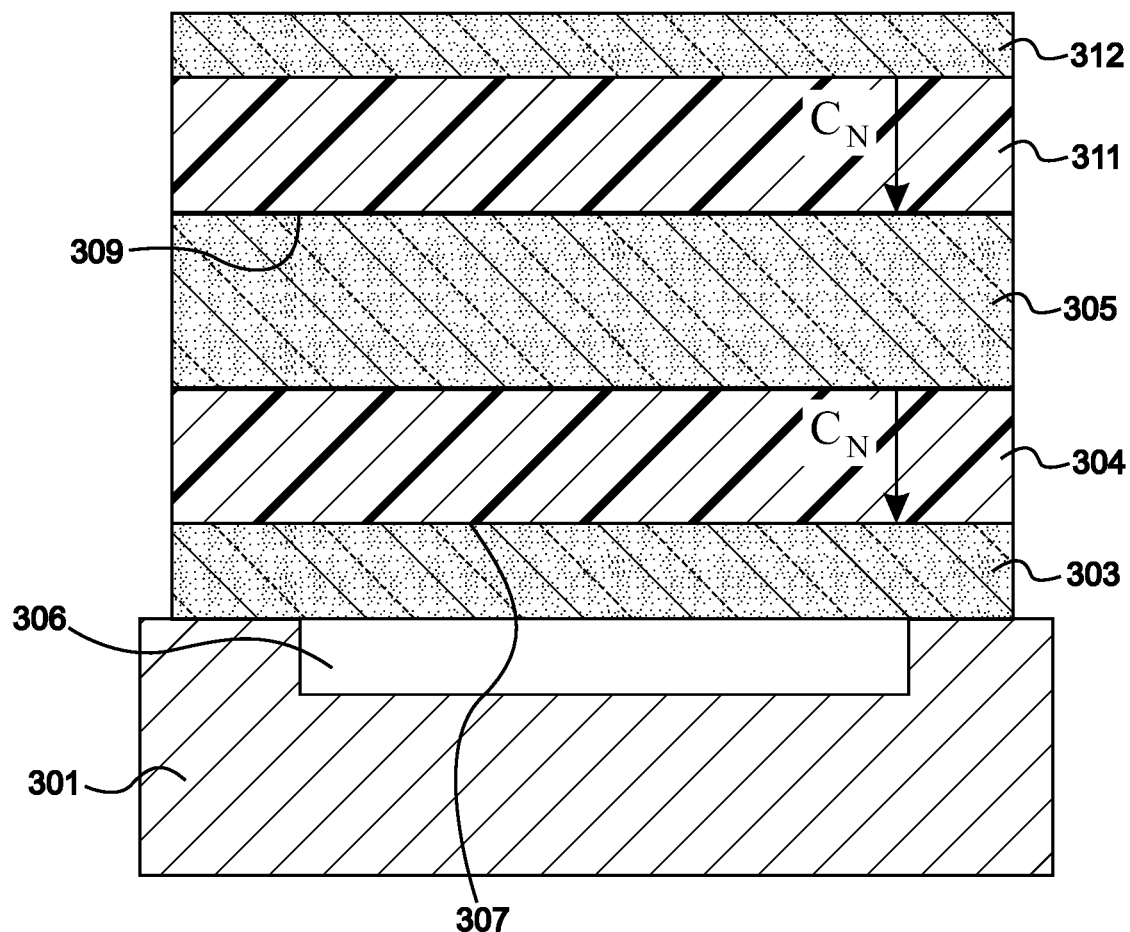
FIG. 3B shows a BAW resonator fabricated in accordance with a representative embodiment.

FIG. 3B shows a simplified cross-sectional view of a BAW resonator 302 in accordance with a representative embodiment. The BAW resonator 302 comprises a single cavity such as described in commonly-owned U.S. patent application Ser. No. 12/201,641 to Bradley, et al. The BAW resonator 302 comprises first electrode 303 disposed over substrate 301; first piezoelectric layer 304 disposed over the first electrode 303; and second electrode 305 disposed over the first piezoelectric layer 304. In a representative embodiment, the first piezoelectric layer 304 is a type-$C_N$ piezoelectric material, and is illustratively type-$C_N$ aluminum nitride (AlN). The substrate 301 illustratively comprises single-crystal silicon (Si).

The second piezoelectric layer 311 is disposed over the second electrode 305; and the third electrode 312 is disposed over the second piezoelectric layer 311. The second piezoelectric layer 311 is a type-$C_N$ piezoelectric material, and is illustratively type-$C_N$ aluminum nitride (AlN). Cavity 306 is formed in the substrate 301 beneath the first electrode 303 by a known method. The cavity 306 provides acoustic isolation as described above. Alternatively, an acoustic isolator (not shown in FIG. 3B) such as described above and comprising alternating layers of comparatively high and low acoustic impedance may be used instead of the cavity 306.

The first electrode 303, the second electrode 305 and the third electrode 312 may be one of a variety of conductive materials, such as metals suitable as electrodes in BAW applications. Generally, materials suitable for the first electrode 103 and the second electrode 105 comprise Refractory metals, Transition metals or Noble Metals. In specific embodiments, the first and second electrodes 103, 105 illustratively comprise one or more of molybdenum (Mo), aluminum (Al), tungsten (W), platinum (Pt), ruthenium (Ru), niobium (Nb), hafnium (Hf) and uranium-238 (U-238), or other low-loss metals, and are fabricated using a known method. The piezoelectric layer 104 is fabricated in accordance with the present teachings.

In a representative embodiment, and unlike FBAR 300 shown in FIG. 3A, the FBAR 302 does not comprise either the first seed layer 308 over an upper surface 307 of the first electrode 303, or the second seed layer 310 disposed over an upper surface 309 of the second electrode 305. Rather, (the type-$C_N$) first and second piezoelectric layers 304, 311 are formed over upper surface 307 and 309 of the first electrode 303 and the second electrode 305, respectively, by methods of representative embodiments described below.

It is appreciated that the FBAR 302 of the representative embodiment comprises an acoustic stack comprising more than one piezoelectric layer having a $C_N$ axis. It is emphasized that other BAW resonator structures comprising an acoustic stack comprising more than one type $C_N$ piezoelectric layer are contemplated. For example, decoupled stacked acoustic resonators comprising more than one FBAR with an acoustic decoupler disposed therebetween are contemplated. In such an embodiment, each of the FBARs would include a type $C_N$ piezoelectric layer fabricated in accordance with the present teachings. The present teachings contemplate forming the type $C_N$ piezoelectric layers over a surface of respective electrodes. Furthermore, in certain BAW structures comprising an acoustic resonator comprising more than one piezoelectric layer, it is desirable to provide piezoelectric layers comprising anti-parallel C-axes (e.g., one type $C_N$ piezoelectric layer, and one type $C_P$ piezoelectric layer). The present teachings also contemplate forming the piezoelectric layers with $C_N$ axes and forming a type $C_P$ piezoelectric layer over another electrode. The type $C_P$ piezoelectric layer is formed using a known method.

Figure 4:
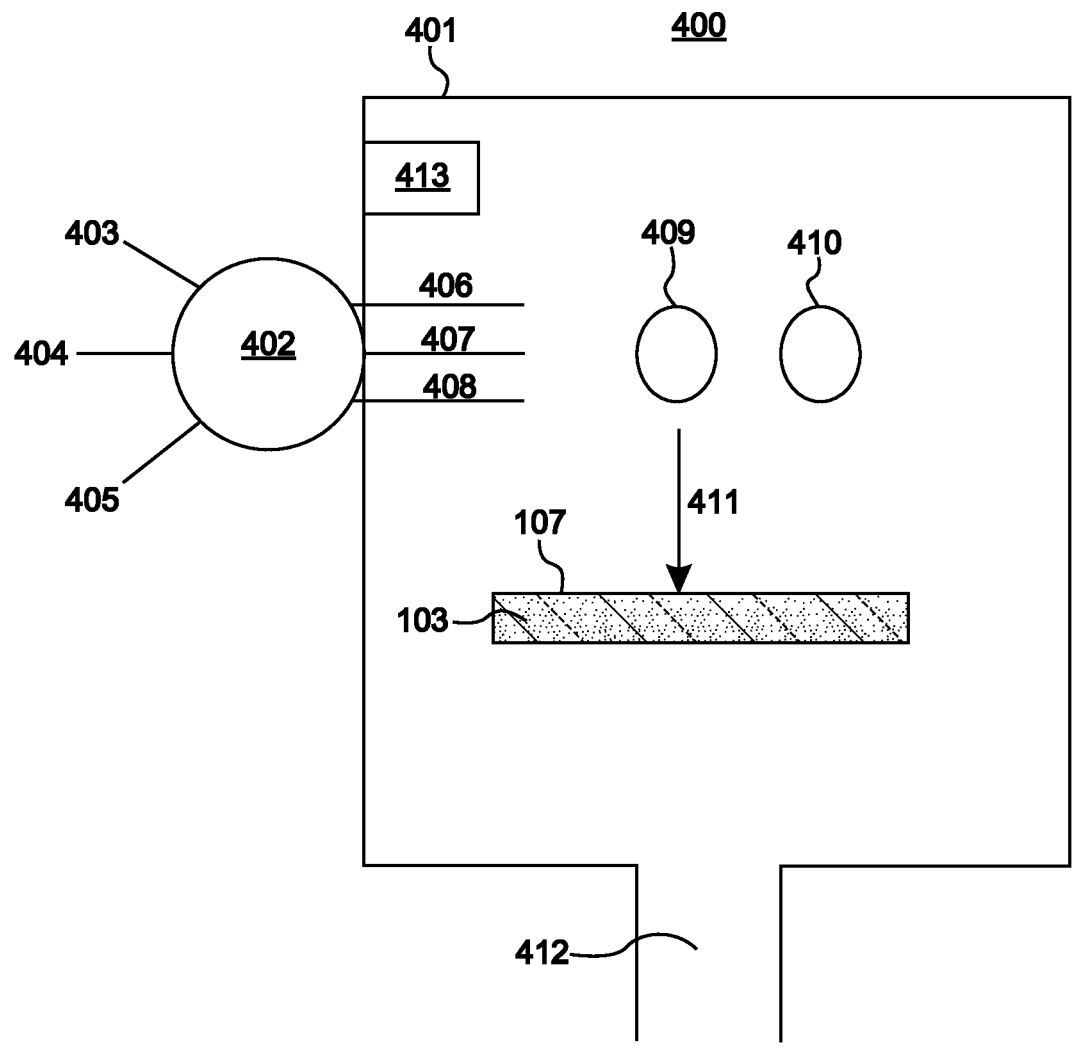
FIG. 4 shows a simplified schematic diagram of a deposition system in accordance with a representative embodiment.

FIG. 4 shows a simplified schematic diagram of a deposition system 400 in accordance with a representative embodiment. The deposition system 400 comprises components commercially available from Advanced Modular Systems, Inc. of Santa Barbara, Calif. USA, for example. In representative embodiments, the deposition system 400 is a sputter deposition system, many of the components and dynamics of which are known to one of ordinary skill in the art. Because many details of the deposition system 400 and sputtering techniques are known, many details are not provided to avoid obscuring the description of the representative embodiments.

The deposition system 400 comprises a reaction chamber 401, which is maintained substantially at vacuum during fabrication of piezoelectric materials of the representative embodiments. The deposition system 400 also comprises gas inlets 403, 404, 405 as inputs to a flow control system 402, which controls the flow of selected gases provided to the gas inlets 403, 404, 405 and the flow rates of the gases provided. A load and lock chamber 413 is provided to allow for the loading of wafers and transfer them to a reaction chamber 401 without breaking vacuum. The flow control system 402 comprises valves (not shown) for selecting the gases to be flowed into the reaction chamber 401, flow controllers (not shown) to measure and control the flow rates thereof, and a controller (not shown) comprising suitable software for controlling the valves. Moreover, the deposition system 400 may comprise an exhaust outlet 412, which has a constant pumping speed, and control of the total pressure in the reaction chamber 401 is provided by changing of gas flow by each flow controller independently or together.

The flow control system 402 may comprise an interface (not shown), such as a graphic user interface (not shown). The deposition system 400 also comprises gas outlets 406, 407, 408, from the flow control system 402. Gas from the gas outlets 406, 407,408 is provided to the reaction chamber 401. Notably, the use of mixed gases (e.g., Ar and $H_2$) from a single source is also contemplated. As described more fully below, these gases form atmospheres used in cleaning and sputter depositing materials 411 from first target 409 and second target 410 over the substrate 101 according to representative embodiments.

As described in connection with representative embodiments below, the gas inlets 403, 404, 405 may selectively provide argon (Ar), nitrogen (N) or hydrogen (H), respectively, or a combination thereof. The gas outlets 406, 407,408 provide a mixture of these gases as to the reaction chamber 401. For example, in forming an Al seed layer (e.g., seed layer 108), Ar plasma may be formed by the outlet of Ar gas from one of the gas outlets 406, 407 in the reaction chamber 401, and results in sputter deposition of seed layer 108 of Al from first and second Al targets 409, 410 over the first electrode 103. After the forming of the seed layer 108, the growth of type-$C_N$ piezoelectric layer (e.g., piezoelectric layer 104) is provided by selectively sputtering the first and second targets 409,410 (e.g., Al) in an Ar/$N_2$ atmosphere, from gas outlets 406, 407.

In another exemplary method where no seed layer is provided, hydrogen ($H_2$) is provided from one of the gas outlets 406, 407 to provide a hydrogen atmosphere useful in removing contaminants on the upper surface 107. The contaminants could include metal oxides, gases such as $H_2O$, $N_2$ or $O_2$ on the upper surface 107, as well as processing residues such as photoresist. After the cleaning step in the hydrogen atmosphere, the growth of type-$C_N$ piezoelectric layer (e.g., piezoelectric layer 104) is provided by selectively sputtering the first and second targets 409, 410 (e.g., Al) in an Ar/$N_2$/$H_2$ atmosphere, from gas outlets 406, 407408 or by pre-mixed source of Ar/H2, and a nitrogen source.

Figure 5:
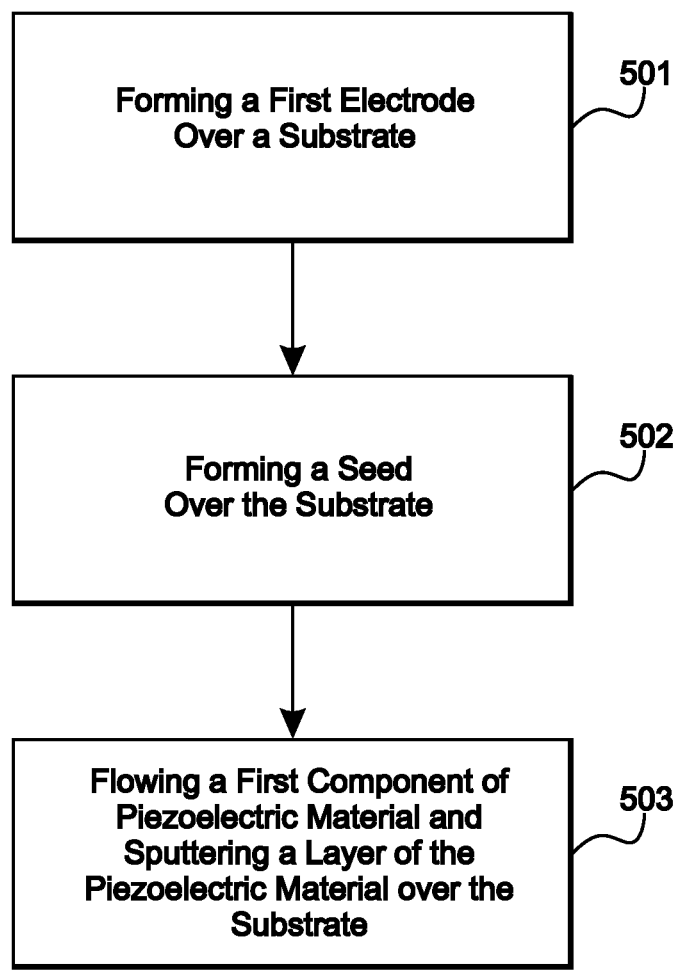
FIG. 5 shows a flow-chart of a method of fabricating a piezoelectric layer in accordance with a first representative embodiment.

Turning to FIG. 5, a method 500 of fabricating a piezoelectric layer in accordance with a representative embodiment is shown in a simplified flow-chart. The method 500 is described with direct reference to the components of FIGS. 1A, 1B and the deposition system 400 of FIG. 4 for illustrative purposes. Fabrication of other FBAR structures, such as FBAR 300, using the method 500, is also contemplated. As will become clearer as the present description continues, the method 500 provides a seed layer 108 over the first electrode 103 in the formation of type-$C_N$ piezoelectric layer 104. As alluded to above, the method 500 may be used to provide first seed layer 308 over the first electrode 303 and the second seed layer 310 over the second electrode 305 of the BAW resonator 300 by repeating the process after forming the intervening layer(s) of the BAW resonator 300.

At 501, the method comprises forming a first electrode over a substrate. Illustratively, the first electrode 103 is formed over the substrate 101. For purposes of description of the method 500, the first electrode 103 is formed by sputter-depositing the selected conductive material over the substrate 101 by a known method, although other methods of forming the first electrode are contemplated. Notably, the formation of the cavity 106 in the substrate 101 may be carried out before fabrication of the acoustic stack 102 of the FBAR 100, with the cavity 106 filled with a sacrificial material (not shown) such as phosphosilicate glass (PSG) or other release processes such as polysilicon and xenon difluoride etchant, known to one of ordinary skill in the art, during the fabrication of layers of the acoustic stack 102; and released after the forming of the layers of the acoustic stack 102. Alternatively, the acoustic isolator 110 is formed in the substrate 101 before forming of the first electrode 103 of the FBAR 109.

The fabrication of the piezoelectric layer 104 begins with cleaning the upper surface 107 of the first electrode 103 before the forming of the piezoelectric layer 104. In a representative embodiment, this cleaning step comprises flowing only Ar to one of the gas inlets 403, 404,405 and to one of the gas outlets 406, 407 to provide an Ar atmosphere in the reaction chamber 401. An RF bias is applied to the first electrode 103 and the reaction chamber 401 is maintained at ground, so that the first electrode 103 functions as a cathode. An Ar plasma is formed in the reaction chamber 401 and bombards the upper surface 107 of the first electrode 103. Illustratively, the RF power is provided in the range of approximately 15 W to approximately 1 kW, and the Ar bombardment of the upper surface 107 of the first electrode is maintained for a few seconds to a few minutes to ensure proper removal of contaminants. Notably, during this cleaning step, no voltage is applied to the first and second targets 409, 410.

It is believed that the comparatively high kinetic energy of the Ar ions provides suitable bombardment of the upper surface 107 to remove substantially therefrom contaminants such as adsorbed water, adsorbed oxide, adsorbed nitrides and native oxides formed on materials commonly used in the fabrication of the first electrode 103. By substantially removing contaminants from the upper surface 107, the formation of a comparatively pure and electropositive Al seed layer 108 is fostered. Thereafter, a type-$C_N$ AlN piezoelectric layer may be formed by deposition of AlN over the seed layer 108 as described above. Furthermore, in an embodiment where the first electrode 103 comprises Pt, by this cleaning step in the Ar atmosphere, it is believed that contaminants such as adsorbed water, adsorbed oxides and adsorbed nitrides are believed to be removed from the Pt, which does not readily form native oxides.

At 502, the method 500 comprises forming the seed layer 108 over the upper surface 107 of the first electrode 103. In a representative embodiment, at this point the RF power to the first electrode 103 is terminated, and AC power is provided between the first target 409 and the second target 410 in the reaction chamber 401. In a representative embodiment, the piezoelectric material comprises two components, and the first and second targets 409, 410 comprise one of the components. Illustratively, AlN is the piezoelectric material, and the first and second targets 409,410 comprise Al. Aluminum is sputtered from the first and second targets 409,410 during the negative potential half-cycle of AC power applied to the first and second targets 409,410 and provides seed layer 108 over the upper surface 107 of the first electrode 103. During the forming of the seed layer 108, Ar is flowed to one of the gas inlets 403, 404, 405 and from one of the gas outlets 406, 407; and no other gases are flowed from the other gas outlet 406, 407. As a result, Ar plasma created in the reaction chamber 401 results in the sputter deposition of a substantially pure aluminum seed layer from the first and second targets 409, 410 and over the upper surface 107 of the first electrode 103. Notably, the longer AC power is applied between the first and second targets 409,410, the thicker the seed layer 108 that is formed.

At 503, and after the seed layer 108 is formed, the method 500 comprises flowing a first component of the piezoelectric layer and sputtering the piezoelectric layer 104 over the substrate 101. In a representative embodiment used to form AlN, the first component comprises nitrogen ($N_2$) gas. The flowing of nitrogen into the reaction chamber 401 comprises providing nitrogen to one of the gas inlets 403, 404, 405 and from one of the gas outlets 406, 407, 408, while continuing the flow of Ar to another of the gas inlets 403, 404, 405 and from the other of the gas outlets 406, 407, 408. During the flowing of nitrogen, AC power is supplied between the first and second targets 409,410, which comprise the second component (e.g., Al) of the piezoelectric material (e.g., AlN), and the piezoelectric material is formed over the surface of the first and second targets 409,410. In a representative embodiment, the AC power has a frequency in the range of approximately 20 kHz to approximately 100 kHz, and power in the range of approximately 4 kW to approximately 7 kW. Illustratively, the AC power has a frequency of 7 kW and a frequency of 40 kHz.

The Ar/$N_2$ plasma is maintained, and sputters the AlN from the first and second targets 409,410 to the seed layer 108, in a preferred orientation to provide type $C_N$ AlN over the seed layer 108. Beneficially, the depositing of the piezoelectric layer 104 in the portion of the method is effected without breaking vacuum conditions in the system 400, and comparatively rapidly after completion of the forming of the seed layer 108. Maintaining vacuum and relatively rapidly beginning the deposition of the piezoelectric layer 104 is believed to substantially prevent adsorption of oxides and nitrides or the formation of other contaminants over the exposed surface (s) of the seed layer 108.

It is believed that because the Al seed layer 108 is comparatively free from contaminants due to the cleaning step in Ar, a substantially electropositive surface of Al is formed over the upper surface 107 of the first electrode 103. The Al seed layer 108 is comparatively highly reactive, and attracts nitrogen of the sputtered AlN. As such, it is believed that AlN is oriented with the nitrogen bonded to the electropositive seed layer of aluminum, and the aluminum of the AlN not being bonded is exposed (i.e., in a structure: seed layer-NAl). Sputtered AlN is then bonded to the exposed aluminum, with the nitrogen bonded to the exposed aluminum (i.e., in a structure: seed layer-N-AL-N-AL). This sequence results in the forming of the crystal structure of type-$C_N$ AlN piezoelectric material, and continues until a suitable thickness of the type-$C_N$ AlN (e.g., piezoelectric layer 104) is realized. In one embodiment, the AlN layer has a thickness of approximately 12,000 Å.

The flow rates of Ar and $N_2$ are set to control the stress of the resultant AlN. Notably, a higher flow rate of Ar results in tensile stress in the AlN; a lower the flow rate of Ar results in compressive stress in the AlN. Similarly, a higher the flow rate of $N_2$ results in tensile stress in the AlN; and a lower flow rate of $N_2$ results in compressive stress in the AlN. In representative embodiments, the flow rate of Ar is in the range of approximately 6 sccm to approximately 25 sccm, and the flow rate of $N_2$ is in the range of approximately 39 sccm to approximately 50 sccm.

After the piezoelectric layer 104 is formed, the second electrode 105 is formed over the piezoelectric layer 104. The second electrode 105 comprises a metal that is sputter-deposited over the piezoelectric layer 104 by a known method. Illustratively, the second electrode 105 comprises the same material as the first electrode 103. Notably, different materials may be used for the electrodes as may be beneficial to the FBAR (BAW resonator) 100.

After the forming of the second electrode 105, the release of the sacrificial material to form the cavity 106 is carried out using a suitable etchant such as HF. As should be appreciated, if unprotected the seed layer 108 may be etched by the etchant as well. In order to prevent this from significantly deteriorating the seed layer 108, a protective layer (not shown) over and/or around the acoustic stack 102 comprising the first electrode 103, the seed layer 108, the piezoelectric layer 104 and the second electrode 105. The protective layer may comprise a metal 'dam' formed from the same metal as the first and second electrodes 103, 105, for example; or may be formed of a material impervious to the etchant (e.g., HF). Such protective layers are formed by known deposition, lithography and etching sequences. Alternatively, a comparatively thin (e.g., 50 Å) seed layer 108 may be provided. It is believed that a comparatively thin seed layer will not be appreciably etched by the etchant used to release the sacrificial material from the cavity 106. Of course, if instead of the cavity 106, the acoustic isolator 110 is implemented as in FBAR 109, the release of sacrificial material and thus the passivation material would not be necessary.

The FBARs 100, 109 described in connection with the method 500 comprise a single piezoelectric layer. As noted above, the acoustic stack of certain resonator structures comprises more than one piezoelectric layer. It is emphasized that the method 500 can be repeated to form a second type-$C_N$ AlN piezoelectric layer. For example, by repeating the method 500, BAW resonator 300 comprising first and second piezoelectric layers 304, 311 is fabricated by forming first and second seed layers 308, 310 respectively over respective upper surfaces 307,309 of first and second electrodes 303, 305.

In certain applications, two or more piezoelectric layers may be included in the acoustic stack, and have opposing C-axes. For example, in an acoustic stack described U.S. Pat. No. 7,515,018, the C-axes of the piezoelectric layers may be antiparallel. As can be appreciated, in a structure comprising two piezoelectric layers in an acoustic stack, the first piezoelectric may be type-$C_N$ piezoelectric material (e.g., first piezoelectric layer 304), and the second piezoelectric layer 311 may be type-$C_P$ piezoelectric material. In such an embodiment, the deposition system 400 and method 500 could be used to form the type-$C_N$ piezoelectric layer by method 500, and the type-$C_P$ piezoelectric layer would be formed by a known method using deposition system 400. For example, the first electrode 103 may be formed as described in 501 above; and the $C_P$ piezoelectric layer may be formed by flowing the first component of the piezoelectric material as described in 503 above. Notably, in forming a $C_P$ piezoelectric layer, the sequence of 502 is not performed.

Figure 6:
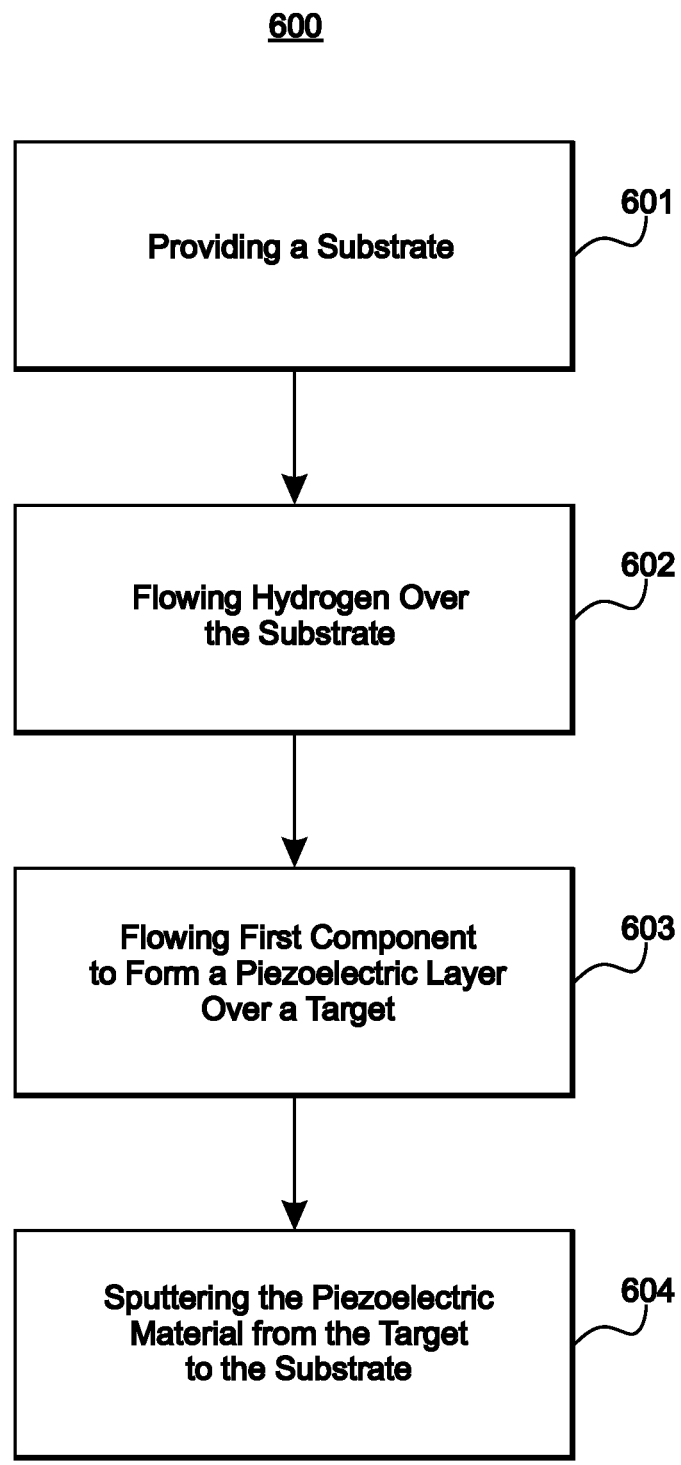
FIG. 6 shows a flow-chart of a method of fabricating a piezoelectric layer in accordance with a second representative embodiment.

FIG. 6 shows a flow-chart of a method 600 of fabricating a piezoelectric layer in accordance with a representative embodiment. Many of the details of the method 600 are common to the method 500, and may not be repeated in order to avoid obscuring the presently described embodiments.

The method 600 is described with direct reference to the components of FIGS. 2A, 2B and the deposition system 400 of FIG. 4 for illustrative purposes. Fabrication of other FBAR structures, such as FBAR 302, using the method 600, is also contemplated. As will become clearer as the present description continues, the method 600 may be used to form type-$C_N$ piezoelectric layer 104 over the upper surface 107 of the first electrode 103. As alluded to above, the method 600 may be used to provide the first piezoelectric layer 304 over the upper surface 307 of the first electrode 303 and the second piezoelectric layer 311 over the upper surface 309 of the second electrode 305 of the BAW resonator 302 by repeating the process after forming the intervening layer(s) of the BAW resonator 302.

At 601 the method comprises providing a substrate. Illustratively, the substrate formed in 601 comprises first electrode 103, which is formed over the substrate 101. For purposes of description of the method 600, the first electrode 103 comprises a metal that is sputter-deposited over the substrate 101 by a known method. Notably, the formation of the cavity 106 in the substrate 101 may be carried out before fabrication of the layers of the acoustic stack 102 of FBAR 100, with the cavity 106 filled with a sacrificial material (not shown) such as phospho-silicate glass (PSG) during the fabrication of layers of the acoustic stack 102, and released after forming the layers of the acoustic stack 102. Alternatively, the acoustic isolator 110 is formed in the substrate 101 before forming of the first electrode 103 of FBAR 109.

At 602, the fabrication of the piezoelectric layer 104 begins with cleaning an upper surface 107 of the first electrode 103 before the forming of the piezoelectric layer 104. In a representative embodiment, this cleaning step comprises flowing Ar and $H_2$ to respective gas inlets 403, 404,405 and from one of the gas outlets 406, 407, 408. An RF bias is applied to the first electrode 103 and the reaction chamber 401 is maintained at ground, so that the first electrode 103 functions as a cathode. As in method 500, an Ar plasma is formed and bombards the upper surface 107 of the first electrode 103. Illustratively, the RF power is provided in the range of approximately 15 W to approximately 1 kW, and the Ar bombardment of the upper surface 107 of the first electrode is maintained for a few seconds to a few minutes to ensure proper removal of contaminants. Notably, during this cleaning step, no voltage is applied to the first and second targets 409,410, and therefore sputtering of material (e.g., Al) from first and second targets 409,410 is insignificant. As such, and in contrast to the method 500, no seed layer (e.g., seed layer 108) is formed over the upper surface 107 of the first electrode 103.

The hydrogen plasma formed in the reaction chamber 401 bombards the upper surface 107 of the first electrode 103. The flow of $H_2$ in 402 provides ionized hydrogen (e.g., $H_2^+$ or $H^+$) in the reaction chamber 401 that provides a reducing agent at the upper surface 107. The ionized hydrogen is believed to react with many contaminants such as water, adsorbed oxides, nitrides and native oxides that may be present on the upper surface 107, and fosters their removal to provide a comparatively clean surface. Moreover, it is believed that the ionized hydrogen forms metal hydrides by saturating dangling bonds on the surface of the metal of the first electrode 103. Furthermore, in an embodiment where the first electrode 103 comprises Pt, by the cleaning step with $H_2$, it is believed that contaminants such as adsorbed water, oxides and nitrides are believed to be removed on Pt, which does not readily form native oxides. Notably, however, because no electrical potential is applied to the first and second targets 409,410 during 602, Al is not appreciably sputtered from the first and second targets 409,410.

At 603 the method 600 comprises flowing a first component of the piezoelectric layer 104. In a representative embodiment used to form AlN, the first component comprises nitrogen ($N_2$) gas. The flowing of nitrogen into the reaction chamber 401 comprises providing nitrogen to one of the gas inlets 403, 404, 405 and from one of the gas outlets 406, 407, 408, while continuing the flow of Ar to another of the gas inlets 403, 404, 405 and from the other of the gas outlets 406, 407, 408.

Notably, $H_2$ may be provided to the same gas outlet 406, 407, 408 that provides Ar; or a separate outlet (not shown) may be provided into the reaction chamber to provide an Ar/N/H atmosphere. Alternatively, after the completion of 602, hydrogen flow may be terminated. The flow rates of Ar and $N_2$ are set to control the stress of the resultant AlN. As described previously, a higher the flow rate of Ar results in tensile stress in the AlN; and a lower the flow rate of Ar results in compressive stress in the AlN. Similarly, a higher the flow rate of $N_2$ results in tensile stress in the AlN; and a lower the flow rate of $N_2$ results in compressive stress in the AlN. In representative embodiments, the flow rate of Ar is in the range of approximately 6 sccm to approximately 25 sccm, and the flow rate of $N_2$ is in the range of approximately 39 sccm to approximately 50 sccm.

During the flowing of nitrogen, AC power is supplied between the first and second targets 409,410, and AlN—H compounds are formed over the surface of the first and second targets 409,410. Moreover, $NH_x$ compounds are believed to be formed in the reaction chamber 401. It is believed that $NH_x$ compounds formed in the reaction chamber 401 fosters the formation of form an AlN—H compound, due to reactions on the surface of the first and second targets 409,410 between Al and NHx.

The greater the frequency of the AC power, the lower the deposition rate of AlN. Accordingly, the frequency of the AC power generally should not exceed 100 kHz. Notably, if the flow of hydrogen is maintained during 603, the cleaning action of hydrogen is realized, but due to its comparatively small atomic mass, hydrogen does not appreciably sputter Al—N from the first and second targets 409,410.

At 604 piezoelectric material is sputtered from the first and second targets 409,410 over the substrate 101. In a specific embodiment, AlN—H formed on the first and second targets 409,410 is sputtered to the upper surface 107 of the first electrode 103. The metal hydrides formed at the upper surface 107 are believed to present an electronegative surface that attracts the aluminum of the AlN—H sputtered from the target. Accordingly, the desired orientation (i.e., metal hydride-AlN—AlN—AlN) to form the crystal structure of type-$C_N$ AlN piezoelectric material is provided and 603 continues until a suitable thickness of the type-$C_N$ AlN (e.g., piezoelectric layer 104) is realized. In one embodiment, the AlN layer has a thickness of approximately 12,000 Å.

It is believed that hydrogen gas molecules ($H_2$) and atoms (H) attach to the AlN on the surface of the metal of the first electrode 103. The hydrogen atoms then penetrate into the interior next to Al side of AlN molecule to form an aluminum-hydride-nitride substance. The AlN molecules are stretched apart to accommodate the hydrogen atoms. The physical structure of the H—AlN molecule may also change. Then as a result of adsorption, the hydrided part of H—AlN aligns and migrates to the surface of the metal hydride formed on the first electrode 103, combines into hydrogen molecules $H_2$ and pulls the Al part of AlN toward to first electrode 103.

Figure 7:
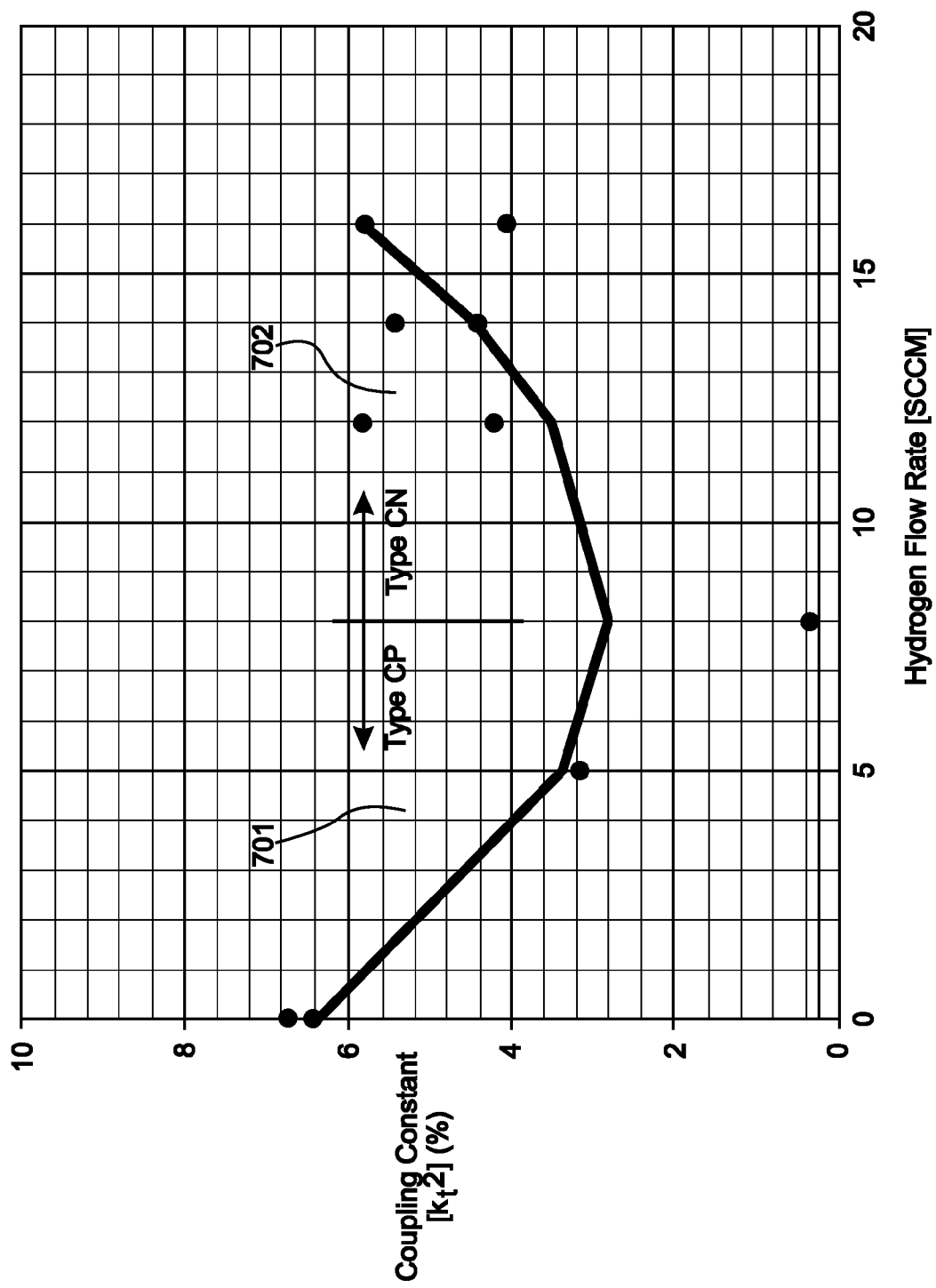
FIG. 7 shows a graph of the coupling coefficient versus hydrogen flow rate during the forming of a piezoelectric layer.

As noted above, the $H_2$ flow into the reaction chamber 401 may be continuous during the forming of the piezoelectric material. As described above, it is believed that the presence of ionized hydrogen in the reaction chamber provides a reducing agent that can remove contaminants such as oxides, nitrides and water, which can interfere with the forming of type-$C_N$ piezoelectric material, or can reduce the coupling coefficient ($kt^2$) and therefore degrade the quality (Q) factor of the piezoelectric material, or both. In a representative embodiment, the flow rate of $H_2$ during the forming of the AlN is at least approximately 8 sccm. In certain embodiments, the flow rate of $H_2$ during the forming of the AlN is as great as approximately 30 sccm. Illustratively, a flow rate of $H_2$ of approximately 14 sccm provides a $C_N$AlN piezoelectric material with $kt^2$ of approximately 5.5%. As described below, the coupling coefficient $kt^2$ of AlN fabricated with continuous flow of $H_2$ at the flow rates noted provides $C_N$ AlN piezoelectric material with $kt^2$ of approximately 2% to approximately 6.6%. FIG. 7 shows the coupling coefficient versus hydrogen flow rate during the forming of the piezoelectric layer in 603.

After the piezoelectric layer 104 is formed, the second electrode 105 is formed over the piezoelectric layer 104. The second electrode 105 comprises a metal that is sputter-deposited over the piezoelectric layer 104 by a known method. Illustratively, the second electrode 105 comprises the same material as the first electrode 103.

The FBARs 200, 201 described in connection with the method 600 comprise a single piezoelectric layer. As noted above, the acoustic stack of certain resonator structures comprises more than one piezoelectric layer. It is emphasized that the method 600 may be repeated to form a second type-$C_N$ AlN piezoelectric layer. For example, by repeating the method 600 in a selected sequence, BAW resonator 302 comprising first and second piezoelectric layers 304, 311, respectively, are formed over respective upper surfaces 307, 309 of first and second electrodes 303, 305.

In certain applications, two or more piezoelectric layers may be included in the acoustic stack, and have opposing C-axes. For example, in an acoustic stack described in U.S. Pat. No. 7,515,018, the C-axes of the piezoelectric layers may be antiparallel. As can be appreciated, in a structure comprising two piezoelectric layers in an acoustic stack, the first piezoelectric may be type-$C_N$ piezoelectric (e.g., first and second piezoelectric layer 304), and the second piezoelectric layer 311 may be type-$C_P$ piezoelectric. In such an embodiment, the deposition system 400 would be used to form the type-$C_N$ piezoelectric layer by method 600, and the type-$C_P$ piezoelectric layer would be formed by a known method using deposition system 400.

If the second piezoelectric layer (e.g., second piezoelectric layer 311) is type-$C_N$ AlN, the cleaning step of method 600 would be carried out to remove contaminants from the electrode over which the second piezoelectric layer is formed (e.g., second electrode 305). If there is no intervening acoustic decoupling layer or intervening electrode, the cleaning step of the method 600 would be carried out to remove contaminants from the surface (e.g., upper surface 309) of the second electrode 305. The forming of the second piezoelectric layer would be effected by repeating 603 of the method 600.

In certain applications, two or more piezoelectric layers may be included in the acoustic stack, and have opposing C-axes. For example, in the acoustic stacks described in U.S. patent application Ser. No. 12/201,641 and U.S. Pat. No. 7,515,018, the C-axes of the piezoelectric layers may be antiparallel. As can be appreciated, in a structure comprising two piezoelectric layers in an acoustic stack, the first piezoelectric may be type-$C_N$ (e.g., first piezoelectric layer 304), and the second piezoelectric layer (e.g., second piezoelectric layer 311) may be type-$C_P$. In such an embodiment, the deposition system 400 would be used to form the type-$C_N$ piezoelectric layer by method 600, and the type-$C_P$ piezoelectric layer would be formed by a known method using deposition system 400.

FIG. 7 shows a graph of intrinsic coupling constant ($kt^2$) versus Hydrogen flow rate of a piezoelectric layer fabricated in accordance with a representative embodiment. In particular, in region 701 of the graph, the intrinsic coupling constant, $kt^2$ is indicative of indicative of $C_P$ AlN formed in accordance with a representative embodiment. By contrast, in region 702, the intrinsic coupling constant, $kt^2$ is indicative of $C_N$ AlN formed by a known method.

In accordance with illustrative embodiments, methods of fabricating piezoelectric materials and acoustic resonators for various applications such as in electrical filters are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A method of fabricating a piezoelectric material comprising a first component and a second component, the method comprising:

providing a substrate;

initially flowing hydrogen over the substrate;

after the initially flowing of the hydrogen over the substrate, flowing the first component to form the piezoelectric material over a surface of a target comprising the second component;

sputtering the piezoelectric material from the target onto the substrate; and flowing the hydrogen over the substrate during the sputtering at a rate sufficient to cause a piezoelectric film having a defined polarity to be formed over the substrate, wherein a seed layer is not formed over the substrate prior to the sputtering.

2. A method of fabricating a piezoelectric material as claimed in claim 1, wherein the piezoelectric film comprises a compression-negative ($C_N$) polarity.

3. A method of fabricating a piezoelectric material as claimed in claim 1, wherein the flowing of hydrogen is continuous during the fabricating of the piezoelectric film.

4. A method of fabricating a piezoelectric material as claimed in claim 1, further comprising, after the depositing:
ceasing flow of the hydrogen;
forming a second substrate over the piezoelectric film; and
sputtering the piezoelectric material from the target over the second substrate.

5. A method of fabricating a piezoelectric material as claimed in claim 4, further comprising, before forming the second substrate flowing hydrogen over the second substrate, wherein the piezoelectric material comprises a compression-negative ($C_N$) material.

6. A method of fabricating a piezoelectric material as claimed in claim 3, wherein the substrates comprise a metal.

7. A method of fabricating a piezoelectric material as claimed in claim 6, wherein the metal comprises one of: molybdenum (Mo), aluminum (Al), tungsten (W), platinum (Pt), and ruthenium (Ru).

8. A method of fabricating a piezoelectric material as claimed in claim 1, wherein the first component comprises nitrogen and the second component comprises aluminum.

9. A method of fabricating a piezoelectric material as claimed in claim 4, wherein the piezoelectric material sputtered on the first substrate comprises a compression-negative ($C_N$) material, and the piezoelectric material sputtered over the second substrate comprises a compression-positive ($C_P$) material.

10. A method of fabricating a piezoelectric material as claimed in claim 1, wherein the flowing of hydrogen during the depositing forms $NH_x$.

11. A method of fabricating a bulk acoustic wave (BAW) resonator having a piezoelectric material consisting essentially of first and second components, the method comprising:
forming a first electrode over a substrate;
forming a seed layer consisting essentially of the second component over the substrate;
flowing the first component of the piezoelectric material to form the piezoelectric material over a surface of a target consisting essentially of the second component of the piezoelectric material; and
sputtering the piezoelectric material from the target onto the seed layer to deposit a piezoelectric layer having a compression-negative ($C_N$) polarity.

12. A method as of fabricating a BAW resonator as claimed in claim 11, further comprising forming a second electrode over the piezoelectric material.

13. A method as of fabricating a BAW resonator as claimed in claim 11, wherein the seed layer comprises aluminum.

14. A method of fabricating a BAW resonator as claimed in claim 13, wherein the first electrode and the second electrode comprise one of molybdenum (Mo), aluminum (Al), tungsten (W), platinum (Pt), and ruthenium (Ru).

15. A method of fabricating a BAW resonator as claimed in claim 11, further comprising, after the forming of the first electrode and before the forming of the seed layer, forming a plasma and removing a contaminant from a surface of the first electrode.

16. A method of fabricating a BAW resonator as claimed in claim 11, further comprising, after the forming of the seed layer, maintaining a flow of an inert gas over the surface of the seed layer during the depositing of the first component and the piezoelectric material.

17. A method of fabricating a BAW resonator as claimed in claim 12, further comprising, after the depositing of the piezoelectric material: sputtering a second piezoelectric material over the second electrode, wherein the second piezoelectric material comprises a compression-positive ($C_P$) polarity.

18. A method of fabricating a BAW resonator as claimed in claim 12, wherein the first electrode and the second electrode comprise a metal.

19. A method of fabricating a BAW resonator as claimed in claim 18, wherein the metal comprises one of: molybdenum (Mo), aluminum (Al), tungsten (W), platinum (Pt), and ruthenium (Ru).

20. A method of fabricating a BAW resonator as claimed in claim 11, wherein the first component comprises nitrogen and the second component comprises aluminum.

21. A method of fabricating a BAW resonator as claimed in claim 11, wherein the seed layer is selected to foster growth of the piezoelectric material comprising the compression-negative ($C_N$) polarity.

22. A method of fabricating a BAW resonator as claimed in claim 11, wherein vacuum is maintained during the method.

23. The method of claim 11, wherein the first component is nitrogen (N) and the second component is aluminum (Al).

* * * * *